(12) United States Patent
Tanaka

(10) Patent No.: US 9,638,725 B2
(45) Date of Patent: May 2, 2017

(54) OPTICAL RECEIVER AND LIGHT RECEPTION CURRENT MONITORING METHOD

(71) Applicant: SUMITOMO ELECTRIC INDUSTRIES, LTD., Osaka-shi, Osaka (JP)

(72) Inventor: Naruto Tanaka, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 314 days.

(21) Appl. No.: 14/362,300

(22) PCT Filed: Jul. 4, 2013

(86) PCT No.: PCT/JP2013/068429
§ 371 (c)(1),
(2) Date: Jun. 2, 2014

(87) PCT Pub. No.: WO2014/010515
PCT Pub. Date: Jan. 16, 2014

(65) Prior Publication Data
US 2014/0333285 A1    Nov. 13, 2014

(30) Foreign Application Priority Data
Jul. 10, 2012 (JP) ................................. 2012-154563

(51) Int. Cl.
*G01R 19/00* (2006.01)
*G01J 1/44* (2006.01)
(Continued)

(52) U.S. Cl.
CPC ............ *G01R 19/0092* (2013.01); *G01J 1/42* (2013.01); *G01J 1/44* (2013.01); *H04B 10/272* (2013.01); *H04B 10/6911* (2013.01)

(58) Field of Classification Search
CPC ............... G01R 19/00; G01J 1/42; H01S 3/13
See application file for complete search history.

(56) References Cited

U.S. PATENT DOCUMENTS 5,563,731 A * 10/1996 Asahi .................... H01S 3/1301
359/341.3
6,072,761 A * 6/2000 Tani .................. G11B 11/10595
369/116
(Continued)

FOREIGN PATENT DOCUMENTS

JP    2004-032003 A    1/2004
JP    2005-121367 A    5/2005
(Continued)

OTHER PUBLICATIONS

Tim Reagan (Editor), "Current Sense Circuit Collection", Linear Technology Application Note 105, Dec. 2005, (relevant portion: pp. 8-14).

*Primary Examiner* — Son Le
*Assistant Examiner* — Alvaro Fortich
(74) *Attorney, Agent, or Firm* — Drinker Biddle & Reath LLP

(57) ABSTRACT

An optical receiver includes a light reception element for receiving an optical signal, a bias voltage supply/monitoring circuit for supplying a bias voltage to the light reception element and generating a monitoring voltage indicating magnitude of an output current of the light reception element, and a constant current source. The bias voltage supply/monitoring circuit is supplied with a remaining current obtained by subtracting the output current of the light reception element from an output current of the constant current source. The bias voltage supply/monitoring circuit converts the remaining current to the monitoring voltage.

14 Claims, 21 Drawing Sheets

(51) Int. Cl.
*H04B 10/272* (2013.01)
*H04B 10/69* (2013.01)
*G01J 1/42* (2006.01)

(56) References Cited

U.S. PATENT DOCUMENTS

| | | | | |
|---|---|---|---|---|
| 7,368,700 | B2* | 5/2008 | Kai | H04Q 11/0005 250/214 LS |
| 7,414,234 | B1 | 8/2008 | Teeter et al. | |
| 7,462,812 | B2* | 12/2008 | Kai | H04Q 11/0005 250/214 LS |
| 2002/0190666 | A1* | 12/2002 | Sakamoto | H01S 5/06804 315/291 |
| 2004/0079866 | A1* | 4/2004 | Nishiyama | H04B 10/6911 250/214 R |
| 2006/0220747 | A1* | 10/2006 | Kiji | H03F 3/08 330/308 |
| 2006/0251429 | A1* | 11/2006 | Yi | H04B 10/66 398/209 |
| 2007/0097349 | A1* | 5/2007 | Wada | G01S 7/493 356/4.06 |
| 2007/0098027 | A1* | 5/2007 | Saitoh | H01S 5/042 372/29.011 |
| 2008/0013577 | A1* | 1/2008 | Saitoh | H01S 5/0683 372/38.01 |
| 2008/0170855 | A1* | 7/2008 | Kai | H04Q 11/0005 398/45 |
| 2008/0224736 | A1* | 9/2008 | Terashima | H01L 27/0629 327/108 |
| 2008/0285914 | A1* | 11/2008 | Matsuoka | G02B 6/12007 385/24 |
| 2009/0245807 | A1 | 10/2009 | Nomura | |
| 2010/0252720 | A1* | 10/2010 | Lan | H01L 31/02019 250/214 A |
| 2010/0295538 | A1 | 11/2010 | Okada | |

FOREIGN PATENT DOCUMENTS

| | | |
|---|---|---|
| JP | 2007-005901 A | 1/2007 |
| JP | 2009-232380 A | 10/2009 |
| JP | 2010-212900 A | 9/2010 |

* cited by examiner

OPTICAL RECEIVER AND LIGHT RECEPTION CURRENT MONITORING METHOD

TECHNICAL FIELD

The present invention relates to an optical receiver and a light reception current monitoring method, and particularly to an optical receiver and a light reception current monitoring method for measuring an output current of a light reception element.

BACKGROUND ART

In 10 G-EPON (10 Gb/s Ethernet® Passive Optical Network) realizing a communication speed of 10 gigabits/second in a public network including optical fibers, an optical signal from a subscriber device is detected by a light reception element such as an APD (Avalanche Photo Diode), and a preamplifier such as a TIA (transimpedance amplifier) is provided in a terminal device in order to amplify a current output by this light reception element.

In addition, reduction in size of optical transmitters and receivers has been demanded, and when a transmitter and a receiver are adjacent to each other for reduction in size, deterioration in reception sensitivity due to crosstalk of a signal from the transmitter to the receiver gives rise to a problem. In particular, in 10 G-EPON, the problem of crosstalk is more noticeable than GE-PON which is EPON realizing a communication speed of 1 gigabit/second. Here, influence by crosstalk on a circuit supplying a bias voltage to an APD is great, and in order to lower crosstalk, it is effective to arrange a bypass capacitor in close vicinity to the APD.

U.S. Pat. No. 7,414,234 (PTD 1) discloses a strength detection (RSSI: Received Signal Strength Indicator) circuit for an optical receiver including a light reception element as below. Namely, an output current of the light reception element is mirrored by a current mirror circuit, and the mirrored current is used for monitoring. Specifically, a capacitor is charged with the mirrored current and the time when a charging voltage exceeds a threshold value is counted.

In such a configuration that a current mirror circuit is employed in the RSSI circuit as above, responsiveness to an optical burst signal becomes an issue. Namely, in the current mirror circuit, while no signal or a weak signal is received, a voltage across the base and the emitter of a transistor lowers and a resistance component (dV/dI) increases, which in turn delays burst response from reception of no signal and a weak signal and burst response to reception of a weak signal. In particular, in a case that a bypass capacitor is arranged on a side of the APD to which a bias voltage is applied, a low-pass filter is formed by the bypass capacitor and the resistance component of the transistor and burst response is delayed.

"Current Sense Circuit Collection," Linear Technology Application Note 105, December 2005 (NPD 1) discloses a circuit in which a current to be monitored is fed through a sense resistor and a voltage across opposing ends of the sense resistor is received by a differential amplifier.

CITATION LIST

Patent Document

PTD 1: U.S. Pat. No. 7,414,234
PTD 2: United States Patent Application Publication No. 2010/0295538

Non Patent Document

NPD 1: "Current Sense Circuit Collection," Linear Technology Application Note 105, December 2005

SUMMARY OF INVENTION

Technical Problem

With the technique described in PTD 1, however, a current mirroring operation speed is low particularly when a light reception level is low.

Specifically, a case that, in a configuration where an optical receiver receives a discontinuous signal, that is, a burst optical signal, a new optical signal is received while light reception strength is zero, that is, an output current of a light reception element is zero ampere, during a period in which no optical signal arrives, is considered.

In this case, since a transistor starts to conduct from a state that a voltage across conductive electrodes of a diode-connected transistor in a current mirror circuit is at zero volt, the transistor at this timing will bring about equivalently very high resistance.

Then, a time constant of a low-pass filter formed by this equivalent resistance and a bypass capacitor connected to a bias voltage supply node to the light reception element is great and burst response is delayed.

In order to solve such a problem, a circuit achieving a suppressed resistance component by providing a sense resistor in parallel to a light reception element so as to avoid lowering in voltage across the conductive electrodes of the transistor and pulling a current from the bias voltage supply node even while there is no signal is considered (see, for example, United States Patent Application Publication No. 2010/0295538 (PTD 2)).

In the configuration where a current mirror circuit is employed as above, however, when a PNP transistor is employed, equivalent resistance calculated as a temperature voltage Vt/a collector current Ic of the PNP transistor should be set to a value satisfying requirements of a response speed, that is, a time constant. Then, in consideration of variation in optimal value of a bias voltage to a light reception element, variation in current mirror circuit, and temperature characteristics of the light reception element, deterioration of monitoring accuracy is great.

In addition, with the technique described in NPD 1, in particular in a case that a light reception level is low, when a value of a sense resistor is set to achieve a desired monitoring rate, a voltage across opposing ends of the sense resistor becomes low, which can affect monitoring accuracy.

Specifically, for example, requirements for a light reception current monitoring function in an optical receiver for a terminal device which establishes point-to-multipoint communication are considered.

For example, in 10 G-EPON, with regard to a light reception level of the terminal device, an uplink optical signal at 10.3125 Gbps is defined as being from −6 dBm to −28 dBm. In addition, in GE-PON, an uplink optical signal at 1.25 Gbps is defined as being from −10 dBm to −29.78 dBm.

In a case that GE-PON and 10 G-EPON both exist in the same system, in order to receive a burst optical signal of low strength of −29.78 dBm after a burst optical signal of high strength of −6 dBm and to monitor light reception strength of this burst optical signal of low strength, at the timing of monitoring, a sense voltage indicating an output current of the light reception element should be stable at approximately −24 dB or lower at the time of reception of a strong signal.

Here, under IEEE802.3av defining 10 G-EPON, a length of a synchronous pattern at the head of an uplink optical signal is defined to be 1.2 μs (microsecond) or less. For example, in order to monitor a light reception level of an uplink optical signal in 600 ns (nanoseconds) within a length of the synchronous pattern, the sense voltage should be stabilized in 600 ns at −24 dB at the time of reception of a strong signal.

In this case, a condition for a time constant τ is expressed as $\exp(-600 \text{ [ns]}/\tau) < 1/250$, and $\tau < 108$ [ns]. Here, 1/250 is a true value for −24 dB and it is obtained from $10^{(-24/10)}$.

In general, a capacitance of a bypass capacitor connected to a bias voltage supply node to a light reception element is often set approximately to 500 pF, and in this case, a value of a sense resistor should be set approximately to 200Ω.

In a case that a burst optical signal of low strength of −29.78 dBm as above is received, even though it is assumed that an APD serves as a light reception element and a current multiplication factor thereof is set to 10, an output current of the light reception element is at most around 10 μA, and a voltage across terminals of the sense resistor is around 2 mV. Therefore, deterioration in monitoring accuracy due to variation or the like of an offset voltage of a differential amplifier is concerned.

Namely, it is difficult to realize high-accuracy light reception current monitoring with the RSSI circuit described in PTD 1, PTD 2, and NPD 1.

This invention was made to solve the problems described above, and an object thereof is to provide an optical receiver and a light reception current monitoring method capable of satisfactorily measuring an output current of a light reception element.

Solution to Problem

In order to solve the problem above, an optical receiver according to one aspect of this invention includes a light reception element for receiving an optical signal, a bias voltage supply/monitoring circuit for supplying a bias voltage to the light reception element and generating a monitoring voltage indicating magnitude of an output current of the light reception element, and a constant current source. The bias voltage supply/monitoring circuit is supplied with a remaining current obtained by subtracting the output current of the light reception element from an output current of the constant current source. The bias voltage supply/monitoring circuit converts the remaining current to the monitoring voltage.

Thus, with such a configuration that a remaining current is used as a current for monitoring, even when light reception strength of the light reception element is low and the output current of the light reception element is low, a value for the current for monitoring is not significantly low, and hence variation in monitoring voltage due to variation or the like of a resistor for voltage conversion in a monitoring circuit is lessened. Thus, even when the output current of the light reception element is low, deterioration in monitoring accuracy can be prevented. Therefore, the output current of the light reception element can satisfactorily be measured. In addition, with the configuration that a remaining current is used as a current for monitoring, the output current of the light reception element is not affected by a monitoring current in the monitoring circuit, and hence a main signal circuit converting an optical signal to an electric signal can satisfactorily be operated.

Preferably, the bias voltage supply/monitoring circuit includes a transistor having a first conductive electrode electrically connected to the constant current source and the light reception element, a second conductive electrode, and a control electrode receiving a reference voltage.

Thus, with such a configuration that a transistor is employed in the bias voltage supply/monitoring circuit, when light reception strength of the light reception element is low, the remaining current substantially serves as an output current of a constant current source, and input resistance from a connection node of the light reception element and the transistor to the transistor is constant. Therefore, a bias voltage to the light reception element is stabilized in a case that light reception strength of the light reception element is low, and monitoring accuracy can be enhanced. In addition, since input resistance of the bias voltage supply/monitoring circuit can be lowered, a time constant of the circuit becomes small and responsiveness of the monitoring circuit can be enhanced.

More preferably, input resistance of the first conductive electrode of the transistor is lower as a current which flows between the first conductive electrode and the second conductive electrode is higher.

With such a configuration, when light reception strength of the light reception element is low, input resistance from a connection node of the light reception element and the transistor to the transistor becomes low, and hence a time constant of the circuit becomes small and responsiveness of the monitoring circuit can be enhanced. In addition, by adjusting an output current value of the constant current source, a value for the input resistance can readily be controlled.

More preferably, the transistor is a PNP transistor having an emitter serving as the first conductive electrode, a collector serving as the second conductive electrode, and a base serving as the control electrode.

Thus, with a configuration employing a PNP transistor, a monitoring voltage can be set to a low voltage, for example, at a ground level, and hence need for components high in withstand voltage for level shift or the like can be obviated.

Preferably, the bias voltage supply/monitoring circuit includes a potential fluctuation suppression circuit for suppressing fluctuation in accordance with magnitude of the output current of the light reception element, of a potential of a connection node of the constant current source, the light reception element, and the bias voltage supply/monitoring circuit. A voltage of the connection node is supplied to the light reception element as the bias voltage.

With such a configuration, regardless of magnitude of light reception strength of the light reception element, a bias voltage to the light reception element is stabilized and monitoring accuracy can be enhanced.

Preferably, the optical receiver further includes a current mirror circuit for outputting a mirror current corresponding to the output current of the constant current source. The constant current source is electrically connected to a reference current output side of the current mirror circuit. The bias voltage supply/monitoring circuit is supplied with the remaining current obtained by subtracting the output current of the light reception element from the mirror current of the current mirror circuit.

With such a configuration, since the output current of the light reception element can be lowered in such a situation that an output current value of the constant current source is exceeded due to high light reception strength of the light reception element, overcurrent failure of the light reception element can be prevented.

More preferably, the bias voltage supply/monitoring circuit generates the bias voltage from a voltage of a connection node of the constant current source and the current mirror circuit.

With such a configuration, it is not necessary to separately provide a voltage source for supplying a bias voltage, and hence a circuit configuration can be simplified.

Preferably, the optical receiver further includes a capacitor connected between a connection node of the constant current source, a first end of the light reception element, and the bias voltage supply/monitoring circuit and a fixed voltage node supplied with a fixed voltage. The light reception element has a second end electrically connected to a reception signal generation portion for generating a reception signal obtained by converting the optical signal to an electric signal based on the output current of the light reception element.

With such a configuration, high-frequency noise in a bias voltage supply path of the light reception element can be removed and conversion of an optical signal to an electric signal and monitoring of the optical signal can satisfactorily be carried out.

Preferably, the optical receiver further includes a sample-and-hold portion for holding and outputting the monitoring voltage in accordance with timing information indicating timing to measure the output current of the light reception element.

With such a configuration, since an operation of a circuit in a stage subsequent to the sample-and-hold portion can be slower, high-accuracy components can be employed. For example, by allowing a low-speed operation of an A/D converter in a subsequent stage, it is no longer necessary to employ components satisfying a high-speed operation as an A/D converter, and selection of components can be facilitated.

Preferably, the optical receiver is provided in a terminal device in a communication system including a plurality of subscriber devices and the terminal device for transmitting and receiving an optical signal through an optical communication line common to the subscriber devices, in which the optical signal from each subscriber device to the terminal device is subjected to time division multiplexing.

By employing an optical receiver in such a passive optical network, even when burst optical signals different in strength are successively received from the subscriber devices, an output current of the light reception element can be detected at high speed with high accuracy.

Preferably, the light reception element receives a burst optical signal, and a time constant $\tau$ of the optical receiver is set to satisfy $$\exp(-t/\tau) < 1/R$$

where t represents a maximum allowable time period until the monitoring voltage is stabilized and R represents a ratio of strength of the burst optical signal.

With such a configuration, since a time constant of a circuit converting an output current of the light reception element to a voltage can sufficiently be small, the output current of the light reception element can satisfactorily be measured.

Preferably, the light reception element receives a burst optical signal, and a time constant $\tau$ of the optical receiver is set to satisfy $$1-\exp(-k/\tau) < err$$

$$\exp(-t/\tau) < (1+err)/R$$

where k represents a longest time period during which the same logic level continues in a preamble portion of the burst optical signal, err represents a maximum allowable error, t represents a maximum allowable time period until the monitoring voltage is stabilized, and R represents a ratio of strength of the burst optical signal.

With such a configuration, since a time constant of a circuit converting an output current of the light reception element to a voltage can sufficiently be small, the output current of the light reception element can satisfactorily be measured. In addition, a time constant at an appropriate value in consideration of a minimum value for the time constant and an allowable error can be set.

More preferably, t is set to 600 nanoseconds and R is set to 250.

With such a configuration, in a communication system where GE-PON and 10 G-EPON both exist in the same system, since a time constant of a circuit converting an output current of the light reception element to a voltage can be set to sufficiently be small, light reception strength of an uplink optical signal can satisfactorily be measured.

In order to solve the problem above, a light reception current monitoring method according to one aspect of this invention is a light reception current monitoring method in an optical receiver including a light reception element for receiving an optical signal, and it includes the steps of generating a remaining current obtained by subtracting an output current of the light reception element from an output current of a constant current source and generating a monitoring voltage indicating magnitude of the output current of the light reception element by converting the remaining current to a voltage.

Thus, with such a configuration that a remaining current is used as a current for monitoring, even when light reception strength of the light reception element is low and the output current of the light reception element is low, a value for the current for monitoring is not significantly low, and hence variation in monitoring voltage due to variation or the like of a resistor for voltage conversion in a monitoring circuit is lessened. Thus, even when the output current of the light reception element is low, deterioration in monitoring accuracy can be prevented. Therefore, the output current of the light reception element can satisfactorily be measured. In addition, with the configuration that a remaining current is used as a current for monitoring, the output current of the light reception element is not affected by a monitoring current in the monitoring circuit, and hence a main signal circuit converting an optical signal to an electric signal can satisfactorily be operated.

Advantageous Effects of Invention

According to the present invention, an output current of a light reception element can satisfactorily be measured.

DESCRIPTION OF EMBODIMENTS

Figure 1:
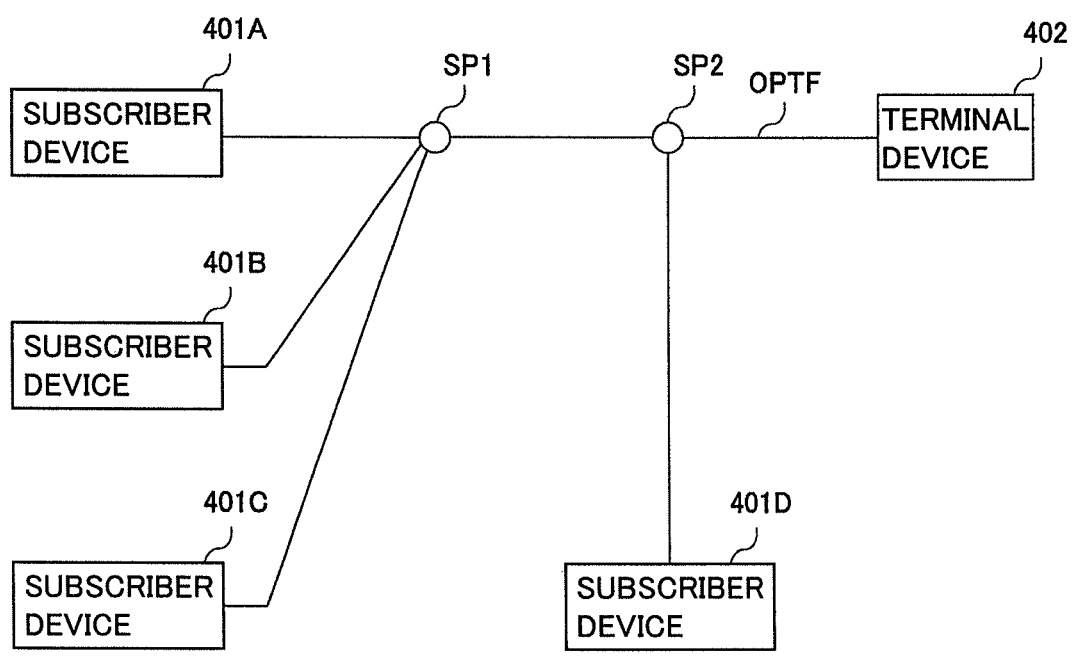
FIG. 1 is a diagram showing a configuration of a PON system according to an embodiment of the present invention.

An embodiment of the present invention will be described hereinafter with reference to the drawings. It is noted that the same or corresponding elements in the drawings have the same reference characters allotted and description thereof will not be repeated.

FIG. 1 is a diagram showing a configuration of a PON system according to an embodiment of the present invention.

Referring to FIG. 1, a PON system 501 is, for example, 10 G-EPON, and includes subscriber devices 401A, 401B, 401C, 401D, a terminal device 402, and splitters SP1, SP2. Subscriber devices 401A, 401B, 401C and terminal device 402 are connected through splitters SP1 and SP2 and an optical fiber OPTF and transmit and receive optical signals to and from one another. Subscriber device 401D and terminal device 402 are connected through splitter SP2 and optical fiber OPTF and transmit and receive an optical signal to and from each other. In PON system 501, an uplink optical signal from subscriber device 401A, 401B, 401C, 401D to terminal device 402 is subjected to time-division multiplexing.

Figure 2:
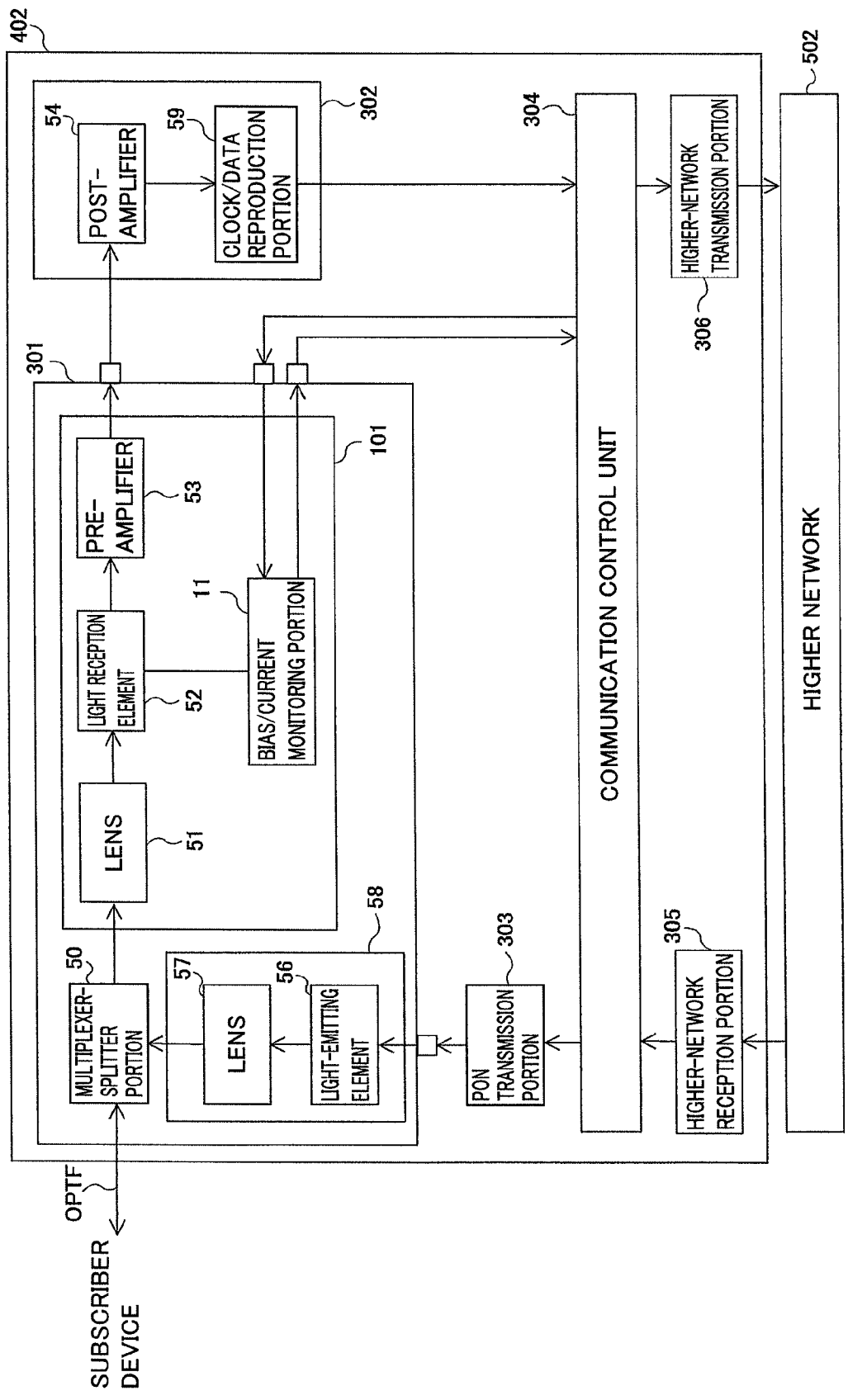
FIG. 2 is a diagram showing a configuration of a terminal device according to the embodiment of the present invention.

FIG. 2 is a diagram showing a configuration of the terminal device according to the embodiment of the present invention.

Referring to FIG. 2, terminal device 402 includes an optical module 301, a PON reception portion 302, a PON transmission portion 303, a communication control unit 304, a higher-network reception portion 305, and a higher-network transmission portion 306. Optical module 301 includes an optical receiver 101, an optical transmitter 58, and a multiplexer-splitter portion 50. Optical receiver 101 includes a bias/current monitoring portion 11, a lens 51, a light reception element 52, and a pre-amplifier 53. Optical transmitter 58 includes a lens 57 and a light-emitting element 56. PON reception portion 302 includes a post-amplifier 54 and a clock/data reproduction portion 59. It is noted that the "bias/current monitoring portion" can also be expressed as a "bias and current monitoring portion." In addition, the "clock/data reproduction portion" can also be expressed as a "clock and data reproduction portion."

A frame from a higher network 502 is received by higher-network reception portion 305 and sent to communication control unit 304. Communication control unit 304 outputs the frame to optical module 301 through PON transmission portion 303. In optical transmitter 58 of optical module 301, light-emitting element 56 converts the frame which is an electric signal received from PON transmission portion 303 into an optical signal and transmits the optical signal to the subscriber device through lens 57 and multiplexer-splitter portion 50.

On the other hand, the optical signal transmitted from the subscriber device to the terminal device is received by optical receiver 101 through multiplexer-splitter portion 50. In optical receiver 101, light reception element 52 is optically coupled to optical fiber OPTF through multiplexer-splitter portion 50 and lens 51. Light reception element 52 outputs a current in accordance with a quantity of light received from optical fiber OPTF. Pre-amplifier 53 amplifies the current received from light reception element 52 and converts the current to a voltage, and outputs the voltage to PON reception portion 302.

In PON reception portion 302, post-amplifier 54 converts the voltage received from pre-amplifier 53 to a reception signal, that is, a voltage having a binary level, and outputs the voltage to clock/data reproduction portion 59. Clock/data reproduction portion 59 reproduces clock and data based on the reception signal received from post-amplifier 54.

Communication control unit 304 decodes the data received from clock/data reproduction portion 59 and reconstitutes a data frame and a control frame. Communication control unit 304 transmits the frame to higher network 502 through higher-network transmission portion 306 based on these reconstituted frames. In addition, communication control unit 304 manages start timing, end timing, and the like of a burst signal from the subscriber device such that optical signals transmitted from the subscriber devices do not temporally conflict, and gives notification to the subscriber device, with a window indicating a period during which a burst signal may be transmitted being included in the control frame. Since a subscriber device transmits a burst signal in an allocated window, communication control unit 304 outputs timing information indicating timing of measurement of the burst signal to bias/current monitoring portion 11 based on the managed timing.

Bias/current monitoring portion 11 detects an output current of light reception element 52 in accordance with timing indicated by the timing information received from communication control unit 304 and outputs a monitoring signal indicating a result of detection to communication control unit 304.

For example, communication control unit 304 causes an output current level of light reception element 52 indicated by the monitoring signal received from bias/current monitoring portion 11 to be stored, and outputs the output current level to a terminal of a monitoring system or the like connected to terminal device 402.

Figure 3:
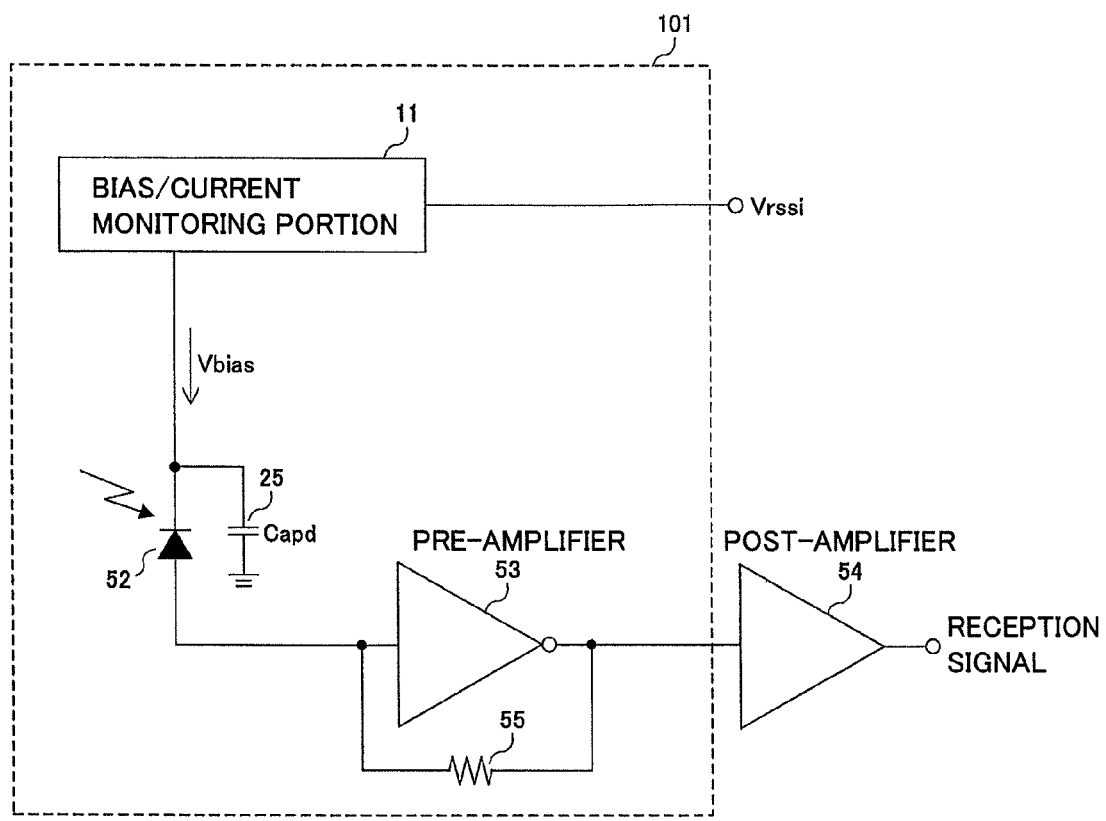
FIG. 3 is a diagram showing a configuration of an optical receiver according to the embodiment of the present invention.

FIG. 3 is a diagram showing a configuration of the optical receiver according to the embodiment of the present invention.

Referring to FIG. 3, optical receiver 101 includes bias/current monitoring portion 11, light reception element 52, a capacitor 25, and pre-amplifier 53 provided with a feedback resistor 55. Light reception element 52 is implemented, for example, by an APD.

Bias/current monitoring portion 11 supplies a bias voltage Vbias to light reception element 52 and measures an output current of light reception element 52. Then, bias/current monitoring portion 11 generates a monitoring voltage Vrssi indicating magnitude of the measured output current of light reception element 52 and outputs the monitoring voltage to communication control unit 304.

Capacitor 25 is provided as a bypass capacitor on a bias voltage application side of light reception element 52. Capacitor 25 is preferably arranged in the vicinity of light reception element 52.

Figure 4:
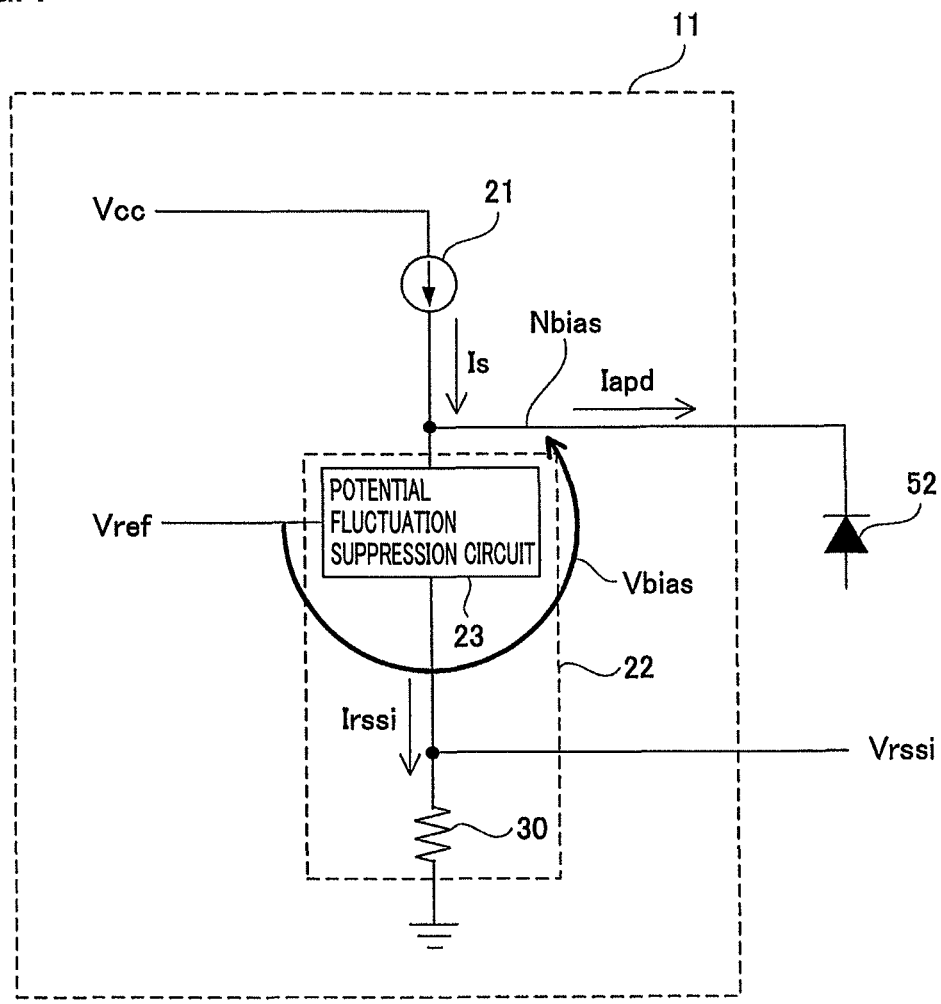
FIG. 4 is a diagram showing a configuration of a bias/current monitoring portion in the optical receiver according to the embodiment of the present invention.

FIG. 4 is a diagram showing a configuration of the bias/current monitoring portion in the optical receiver according to the embodiment of the present invention.

Referring to FIG. 4, bias/current monitoring portion 11 includes a constant current source 21 and a bias voltage supply/monitoring circuit 22. Bias voltage supply/monitoring circuit 22 includes a potential fluctuation suppression circuit 23 and a resistor 30. It is noted that the "bias voltage supply/monitoring circuit" can also be expressed as a "bias voltage supply and monitoring circuit."

Constant current source 21 generates a constant current Is and outputs the constant current to bias voltage supply/monitoring circuit 22 and light reception element 52. Constant current Is is sufficiently greater than a maximum value of an output current Iapd of light reception element 52.

Bias voltage supply/monitoring circuit 22 supplies bias voltage Vbias to light reception element 52 and generates monitoring voltage Vrssi indicating magnitude of output current Iapd of light reception element 52.

Bias voltage supply/monitoring circuit 22 is supplied with a remaining current Irssi obtained by subtracting output current Iapd of light reception element 52 from output current Is of constant current source 21. Then, bias voltage supply/monitoring circuit 22 converts remaining current Irssi to monitoring voltage Vrssi.

More specifically, in bias/current monitoring portion 11, an output node of constant current source 21, a current input node of bias voltage supply/monitoring circuit 22, and a cathode of light reception element 52 are connected. Thus, bias/current monitoring portion 11 has a function to subtract output current Iapd of light reception element 52 from output current Is of constant current source 21 and outputs monitoring voltage Vrssi obtained by subjecting subtracted remaining current Irssi to current-voltage conversion.

Resistor 30 has a first end connected to potential fluctuation suppression circuit 23 and a second end connected to a ground node supplied with a ground voltage. Remaining current Irssi is converted to a voltage by resistor 30 and output from a connection node of potential fluctuation suppression circuit 23 and the first end of resistor 30 as monitoring voltage Vrssi.

In addition, bias/current monitoring portion 11 generates bias voltage Vbias to light reception element 52 based on a reference voltage Vref.

Potential fluctuation suppression circuit 23 suppress fluctuation in accordance with magnitude of output current Iapd of light reception element 52, of a potential of a connection node Nbias of constant current source 21, light reception element 52, and bias voltage supply/monitoring circuit 22. A voltage of this connection node Nbias is supplied to light reception element 52 as bias voltage Vbias.

Thus, with such a configuration that remaining current Irssi is used as a current for monitoring, even when light reception strength of light reception element 52 is low and output current Iapd is low, remaining current Irssi which is a current for monitoring does not significantly become low, and hence variation in monitoring voltage Vrssi due to variation or the like of resistor 30 for voltage conversion in bias voltage supply/monitoring circuit 22 is lessened. Thus, even when output current Iapd of light reception element 52 is low, deterioration in monitoring accuracy can be prevented.

In addition, with the configuration that remaining current Irssi is used as a current for monitoring, output current Iapd of light reception element 52 is not affected by a current for monitoring in bias voltage supply/monitoring circuit 22, and hence a main signal circuit such as pre-amplifier 53 converting an optical signal to an electric signal can satisfactorily be operated.

Figure 5:
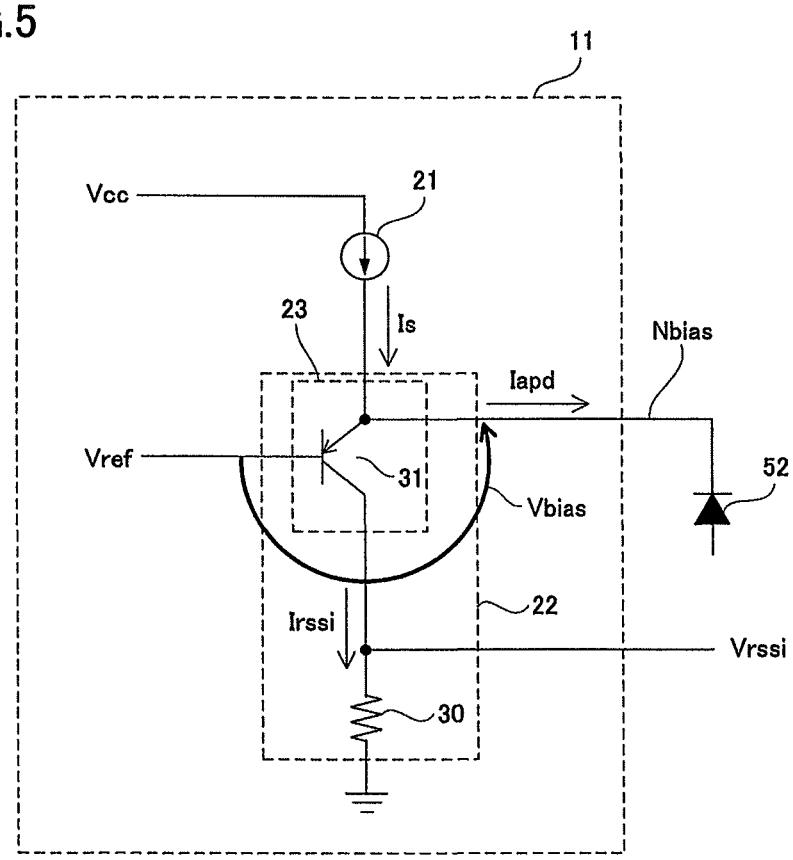
FIG. 5 is a diagram showing a detailed configuration of a bias voltage supply/monitoring circuit in the optical receiver according to the embodiment of the present invention.

FIG. 5 is a diagram showing a detailed configuration of the bias voltage supply/monitoring circuit in the optical receiver according to the embodiment of the present invention.

Referring to FIG. 5, potential fluctuation suppression circuit 23 includes a transistor 31 having a first conductive electrode electrically connected to constant current source 21 and light reception element 52, a second conductive electrode, and a control electrode receiving reference voltage Vref. As a current which flows between the first conductive electrode and the second conductive electrode is higher, input resistance of the first conductive electrode of transistor 31 is lower.

Transistor 31 is, for example, a PNP transistor having an emitter serving as the first conductive electrode, a collector serving as the second conductive electrode, and a base serving as the control electrode. It is noted that PNP transistor 31 may be another P-type transistor such as a P-channel MOS (Metal Oxide Semiconductor) transistor.

More specifically, PNP transistor 31 has the base receiving reference voltage Vref, the emitter receiving output current Is of constant current source 21, and the collector connected to resistor 30.

In this circuit, input resistance Rin at the current input node of bias voltage supply/monitoring circuit 22, that is, the emitter of PNP transistor 31, is expressed in an equation (A1) below:

$$Rin = Vt/Ic \qquad (A1)$$

where Vt represents a temperature voltage of PNP transistor 31 and Ic represents a collector current of PNP transistor 31 corresponding to remaining current Irssi. In addition, Vt is expressed in an equation (A2) below:

$$Vt = k \times T/q \quad (A2)$$

where k represents a Boltzmann constant, T represents an absolute temperature, and q represents elementary charge.

It can be seen from Equation (A1) that input resistance Rin can be controlled by setting output current Is of constant current source 21. In addition, when light reception strength of light reception element 52 is low, collector current Ic is asymptotic to constant current Is and hence input resistance can be lowered.

Namely, with a configuration including PNP transistor 31, even when light reception strength of light reception element 52 is low, such collector current Ic as lowering input resistance Rin can be fed and hence time constant τ can be set to be sufficiently small.

In addition, when light reception strength of light reception element 52 is low, remaining current Irssi is substantially equal to output current Is of constant current source 21 and input resistance Rin from connection node Nbias of light reception element 52 and PNP transistor 31 to PNP transistor 31 becomes constant. Therefore, even when light reception strength of light reception element 52 is low, bias voltage Vbias to light reception element 52 is stabilized and monitoring accuracy can be enhanced.

It is noted that bias voltage Vbias to light reception element 52 is a voltage resulting from addition of a voltage across the base and the emitter of PNP transistor 31 to reference voltage Vref.

Figure 6:
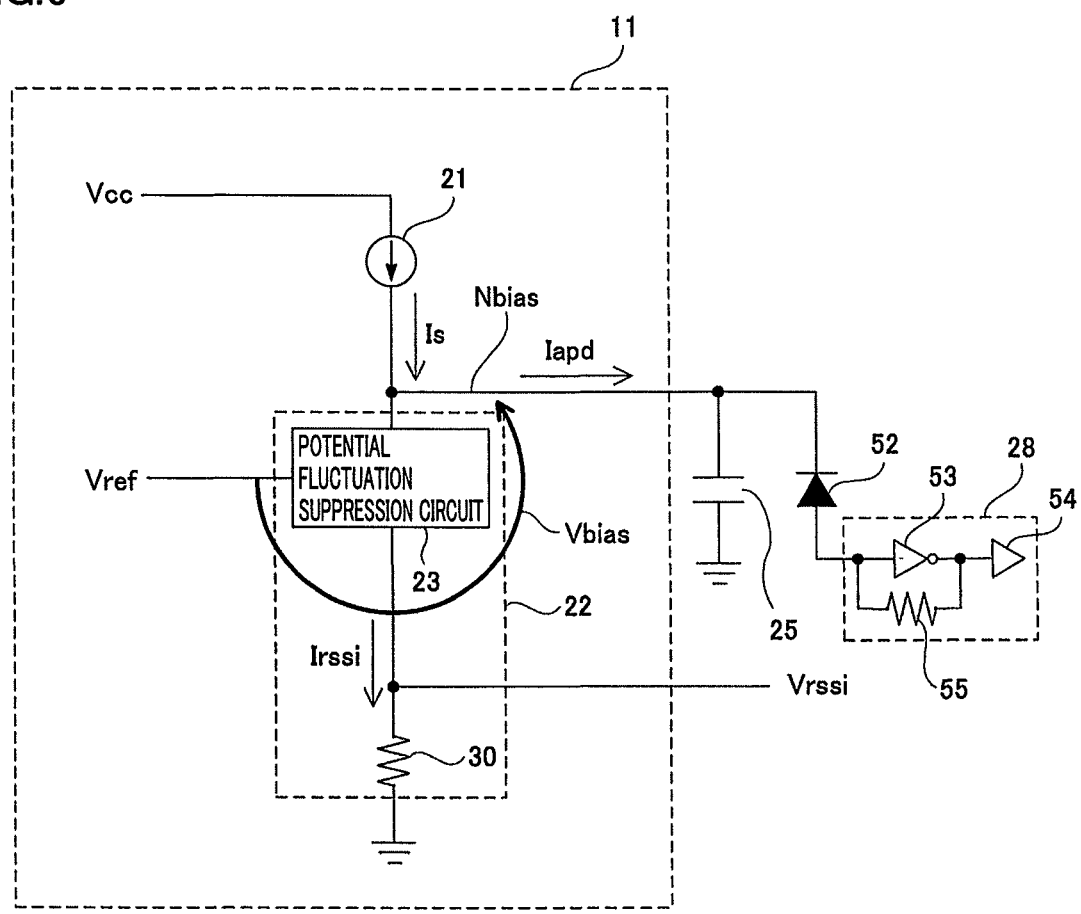
FIG. 6 is a diagram showing a configuration in which a circuit for noise removal and a circuit of a main signal system are added to the circuit shown in FIG. 4.

FIG. 6 is a diagram showing a configuration in which a circuit for noise removal and a circuit of a main signal system are added to the circuit shown in FIG. 4.

Referring to FIG. 6, capacitor 25 is connected between connection node Nbias of constant current source 21, the cathode of light reception element 52, and bias voltage supply/monitoring circuit 22 and a fixed voltage node supplied with a fixed voltage such as a ground voltage. Namely, capacitor 25 has a first end connected to the cathode of light reception element 52 and a second end connected to a ground node.

In addition, an anode of light reception element 52 is connected to an input node of pre-amplifier 53. A reception signal generation portion 28 includes, for example, pre-amplifier 53, post-amplifier 54, and feedback resistor 55. Reception signal generation portion 28 is electrically connected to the anode of light reception element 52 and generates a reception signal resulting from conversion of an optical signal to an electric signal based on output current Iapd of light reception element 52.

Here, in GE-PON, the same logic level in an 8B10B idle pattern in a preamble portion continues for 5 bits, that is for 4 ns, at the maximum. A preamble length is 800 nm at the maximum.

In 10 G-EPON, the same logic level in a synchronous pattern in a preamble portion continues for 6 bits, that is, for 0.6 ns, at the maximum. A preamble length is 1.2 μs at the maximum.

Then, since a data pattern in a payload portion is arbitrary, a continuous code time period, that is, a time period during which the same logic level continues, can be longer. Therefore, convergence of a monitoring voltage within a synchronous pattern of the preamble portion leads to improvement in monitoring accuracy. In addition, in an actual system, from a point of view of interconnectivity between vendors, convergence of a monitoring voltage within a synchronous pattern may be required.

Here, monitoring of a light reception level of an uplink optical signal in 600 ns within a length of a synchronous pattern is aimed.

When GE-PON and 10 G-EPON both exist in the same system, a strength ratio of a burst signal is approximately 24 dB as described previously.

Here, in optical receiver 101, time constant τ of a circuit in bias/current monitoring portion 11 is set, for example, to satisfy an equation (B1) below:

$$\exp(-t/\tau) < 1/R \quad (B1)$$

where t represents a maximum allowable time period until monitoring voltage Vrssi is stabilized and R represents a ratio of strength of the burst optical signal. In Equation (B1), for example, t is set to 600 nanoseconds and R is set to 250. Here, 250 is a true value for −24 dB and it is obtained from $10^{(-24/10)}$.

Then, with input resistance of bias voltage supply/monitoring circuit 22 being defined as Rin and a capacitance of capacitor 25 being defined as Capd, Rin and Capd should only be set such that τ satisfies this condition because τ=Rin×Capd.

In addition, for example, in optical receiver 101, time constant τ of a circuit in bias/current monitoring portion 11 is set to satisfy the following:

$$1 - \exp(-k/\tau) < \text{err} \quad (C1)$$

where k represents a continuous code time period in a preamble portion of a burst signal from a subscriber device, that is, a longest time period during which the same logic level continues in the preamble portion, and err represents an error in a current value to be measured.

For example, in a case of k/τ=1/5 in Equation (C1), err=18%.

With such a configuration, in a pattern for synchronization of the preamble portion of the burst signal, the time constant can sufficiently be longer than a time period during which the same logic level continues, and hence an output current of light reception element 52 can satisfactorily be measured.

Alternatively, for example, in optical receiver 101, time constant τ of a circuit in bias/current monitoring portion 11 is set to satisfy the following:

$$\exp(-t/\tau) < (1+\text{err})/R \quad (C2)$$

where t represents a maximum allowable time period until monitoring voltage Vrssi is stabilized and R represents a strength ratio between burst signals assumed in PON system 501.

For example, in Equation (C2), in a case of t/τ=1/8 and R=250, err=8.4%.

With such a configuration, since a time constant of a circuit converting an output current of a light reception element to a voltage can sufficiently be small, the output current of the light reception element can satisfactorily be measured. In addition, a time constant at an appropriate value in consideration of a minimum value for the time constant and an allowable error can be set.

It is noted that, in Equation (C2), depending on timing when a burst signal to be monitored is provided to optical receiver 101, a value in the right side is smaller than (1+err)/R and requirements for time constant τ may become strict.

Assuming that a continuous code time period in the preamble portion is set to 4 ns and an allowable maximum error is set to 20%, time constant τ is expressed in the following equation, based on Equation (C1).

$$1-\exp(-4\ [ns]/\tau)<0.2$$

$$\tau>18\ [ns]$$

In addition, time constant τ is expressed in the following equation, based on Equation (C2).

$$\exp(-600\ [ns]/\tau)<(1+0.2)/250$$

$$\tau>112.377\ldots\ [ns]$$

Therefore, relation of 18 ns<τ<approximately 112 ns is satisfied. Then, with input resistance of bias voltage supply/monitoring circuit 22 being defined as Rin and a capacitance of capacitor 25 being defined as Capd, Rin and Capd should only be set such that τ satisfies this condition because τ=Rin×Capd.

Figure 7:
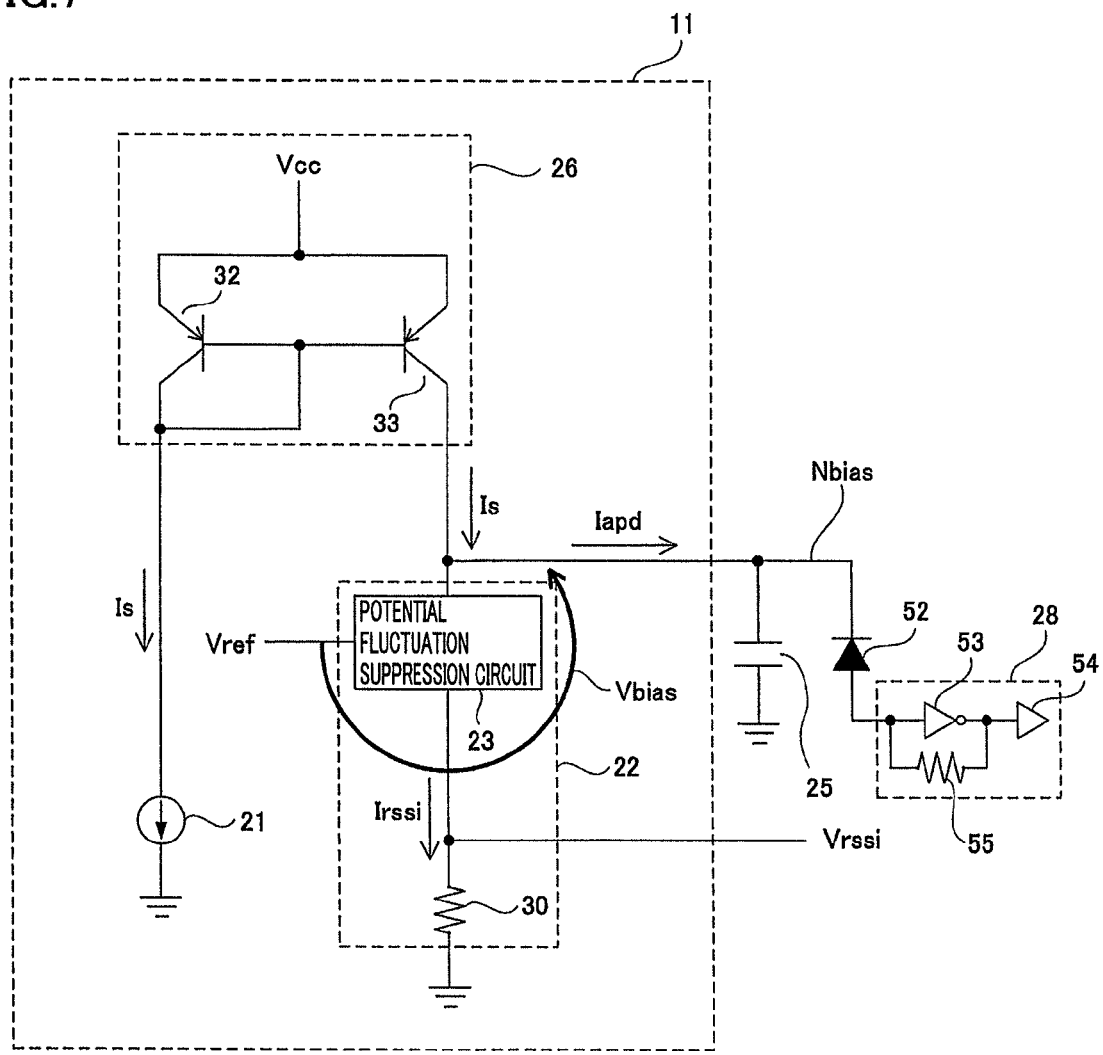
FIG. 7 is a diagram showing a detailed configuration of the bias/current monitoring portion in the optical receiver according to the embodiment of the present invention.

FIG. 7 is a diagram showing a detailed configuration of the bias/current monitoring portion in the optical receiver according to the embodiment of the present invention.

Referring to FIG. 7, bias/current monitoring portion 11 further includes a current mirror circuit 26.

Current mirror circuit 26 outputs a mirror current corresponding to output current Is of constant current source 21. Constant current source 21 is electrically connected to a low potential side and a reference current output side of current mirror circuit 26. Bias voltage supply/monitoring circuit 22 is electrically connected to the low potential side and a mirror current output side of current mirror circuit 26.

Bias voltage supply/monitoring circuit 22 is supplied with remaining current Irssi obtained by subtracting output current Iapd of light reception element 52 from a mirror current of current mirror circuit 26.

More specifically, current mirror circuit 26 includes PNP transistors 32, 33. It is noted that PNP transistors 32, 33 may be other P-type transistors such as a P-channel MOS transistor.

PNP transistor 32 has an emitter connected to a power supply node supplied with a power supply voltage Vcc and a base and a collector connected to the input node of constant current source 21. PNP transistor 33 has an emitter connected to the power supply node supplied with power supply voltage Vcc, a base connected to the base and the collector of PNP transistor 32, and a collector connected to bias voltage supply/monitoring circuit 22, capacitor 25, and light reception element 52.

In this circuit, output current Is of constant current source 21 provided on the low potential side at a ground level is copied by current mirror circuit 26 constituted of PNP transistors 32, 33, so that a constant current source for bias voltage supply/monitoring circuit 22 is implemented. Namely, constant current source 21 is provided on a low side and output current Is of constant current source 21 is mirrored by using PNP transistors 32, 33.

When light reception strength of light reception element 52 is high and a level of output current Iapd of light reception element 52 is about to exceed output current Is of constant current source 21, a voltage across the collector and the emitter of PNP transistor 33 increases, and hence a voltage at connection node Nbias, that is, the cathode of light reception element 52, lowers.

Then, as a voltage of connection node Nbias lowers to a threshold voltage of light reception element 52, that is, a forward voltage, a time average value of output current Iapd decreases. Alternatively, when light reception element 52 is implemented by an APD, a current multiplication factor of light reception element 52 lowers and output current Iapd decreases.

Namely, in the circuit shown in FIG. 7, a limit function preventing overcurrent failure of light reception element 52 can be realized.

Figure 8:
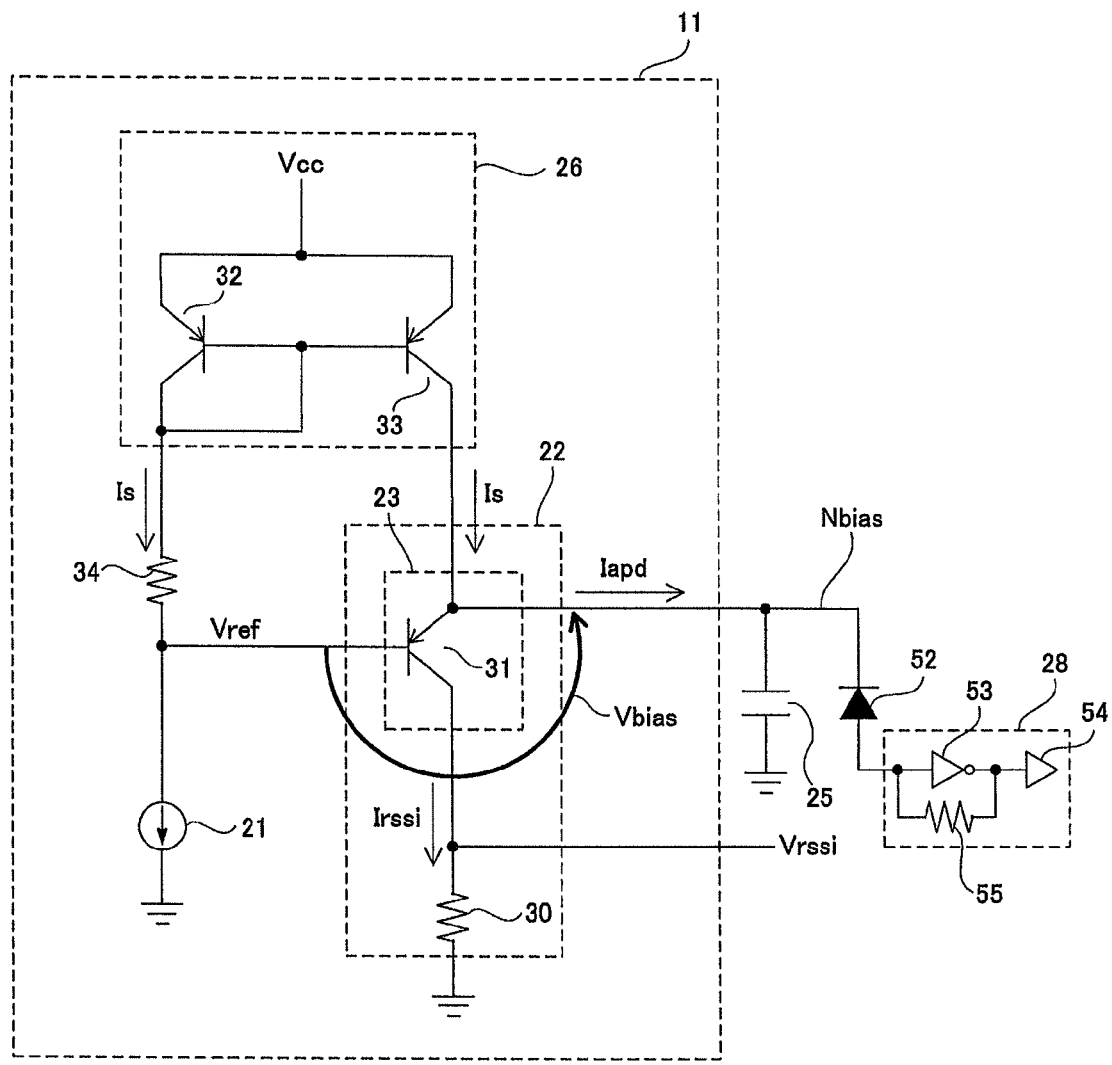
FIG. 8 is a diagram showing a detailed configuration of the bias/current monitoring portion in the optical receiver according to the embodiment of the present invention.

FIG. 8 is a diagram showing a detailed configuration of the bias/current monitoring portion in the optical receiver according to the embodiment of the present invention.

Referring to FIG. 8, bias/current monitoring portion 11 further includes a resistor 34 as compared with the configuration shown in FIG. 7. Bias voltage supply/monitoring circuit 22 generates bias voltage Vbias from a voltage of a connection node of constant current source 21 and current mirror circuit 26 through resistor 34.

More specifically, PNP transistor 31 has the emitter electrically connected to current mirror circuit 26 and light reception element 52, the collector, and the base electrically connected to a connection node of constant current source 21 and resistor 34.

Namely, in bias voltage supply/monitoring circuit 22, resistor 34 having an appropriate resistance value is provided between a low-side current source, that is, constant current source 21, and the collector of PNP transistor 32 for current mirroring, and a node on a low side of resistor 34, that is, a connection node of resistor 34 and constant current source 21, is connected to bias voltage supply/monitoring circuit 22. Thus, a voltage of the connection node of resistor 34 and constant current source 21 is supplied to bias voltage supply/monitoring circuit 22 as reference voltage Vref.

With such a configuration, reference voltage Vref can be generated with power supply voltage Vcc serving as the reference, and hence it is not necessary to separately prepare a reference voltage source.

It is noted that, when bias voltage supply/monitoring circuit 22 operates even though a resistance value for resistor 34 is 0Ω, specifically, when PNP transistor 31 in bias voltage supply/monitoring circuit 22 is turned on, resistor 34 does not have to be provided. In this case, a connection node of constant current source 21 and PNP transistor 32 for current mirroring is connected to bias voltage supply/monitoring circuit 22.

Figure 9:
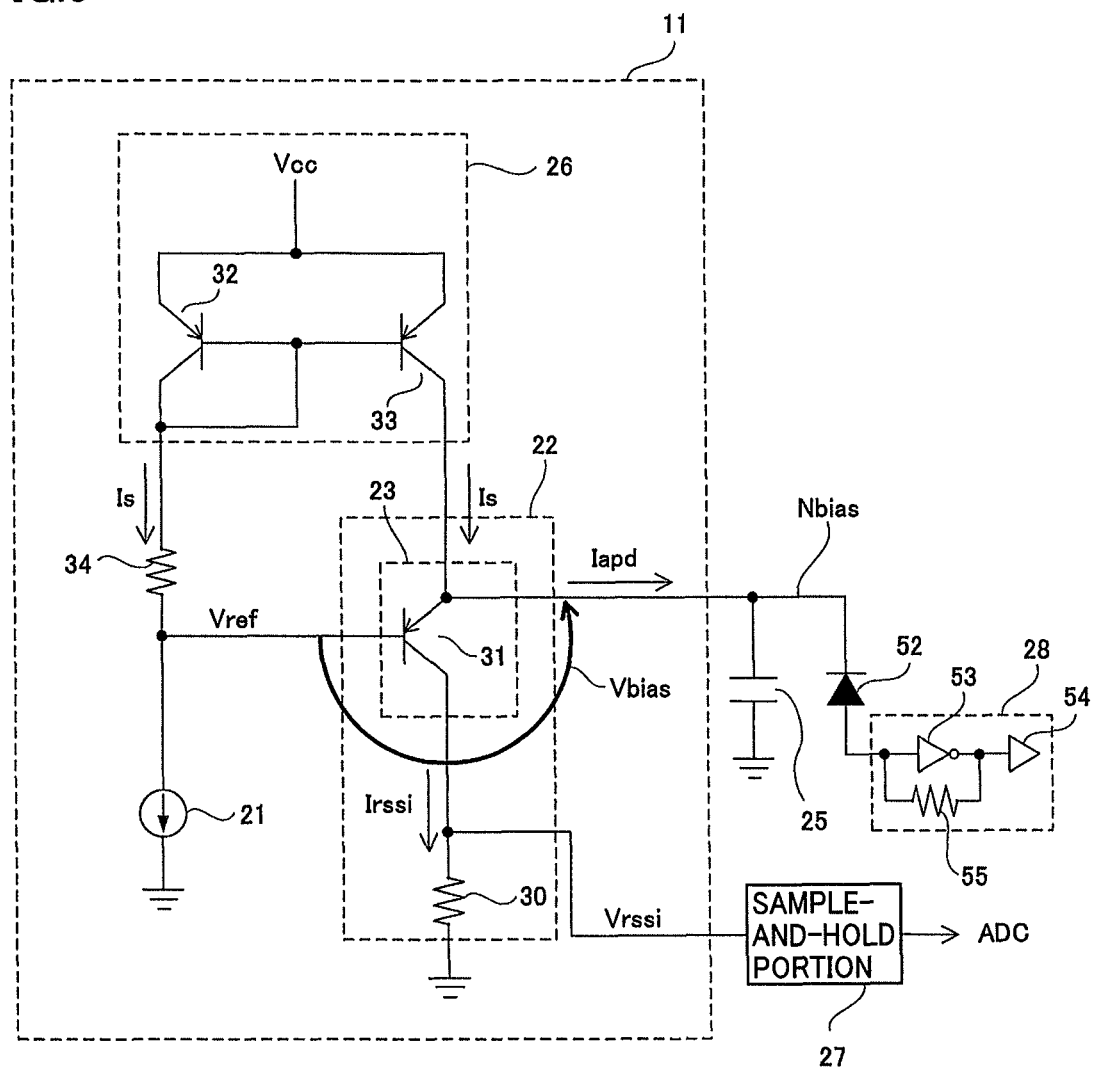
FIG. 9 is a diagram showing a configuration in which a sample-and-hold function is added to the circuit shown in FIG. 7.

FIG. 9 is a diagram showing a configuration in which a sample-and-hold function is added to the circuit shown in FIG. 7.

Referring to FIG. 9, optical receiver 101 further includes a sample-and-hold portion 27.

Sample-and-hold portion 27 holds monitoring voltage Vrssi output from bias voltage supply/monitoring circuit 22 and outputs the monitoring voltage to an ADC (analog/digital converter) in communication control unit 304, in accordance with timing information from communication control unit 304 indicating timing to measure an output current of light reception element 52.

This ADC is contained, for example, in a microcomputer and converts a level of monitoring voltage Vrssi received from sample-and-hold portion 27 to a digital value. Communication control unit 304 uses this digital value to calculate light reception strength.

With such a configuration, a speed of an operation in a circuit in a stage subsequent to sample-and-hold portion 27 can be lowered. In addition, with such a configuration for carrying out sampling and holding by obtaining timing information from communication control unit 304, timing to detect a burst signal can be known and a result of measurement at appropriate timing can reliably be obtained.

Contents of verification of an operation of optical receiver 101 by the inventor of the present application will now be described in detail.

Figure 10:
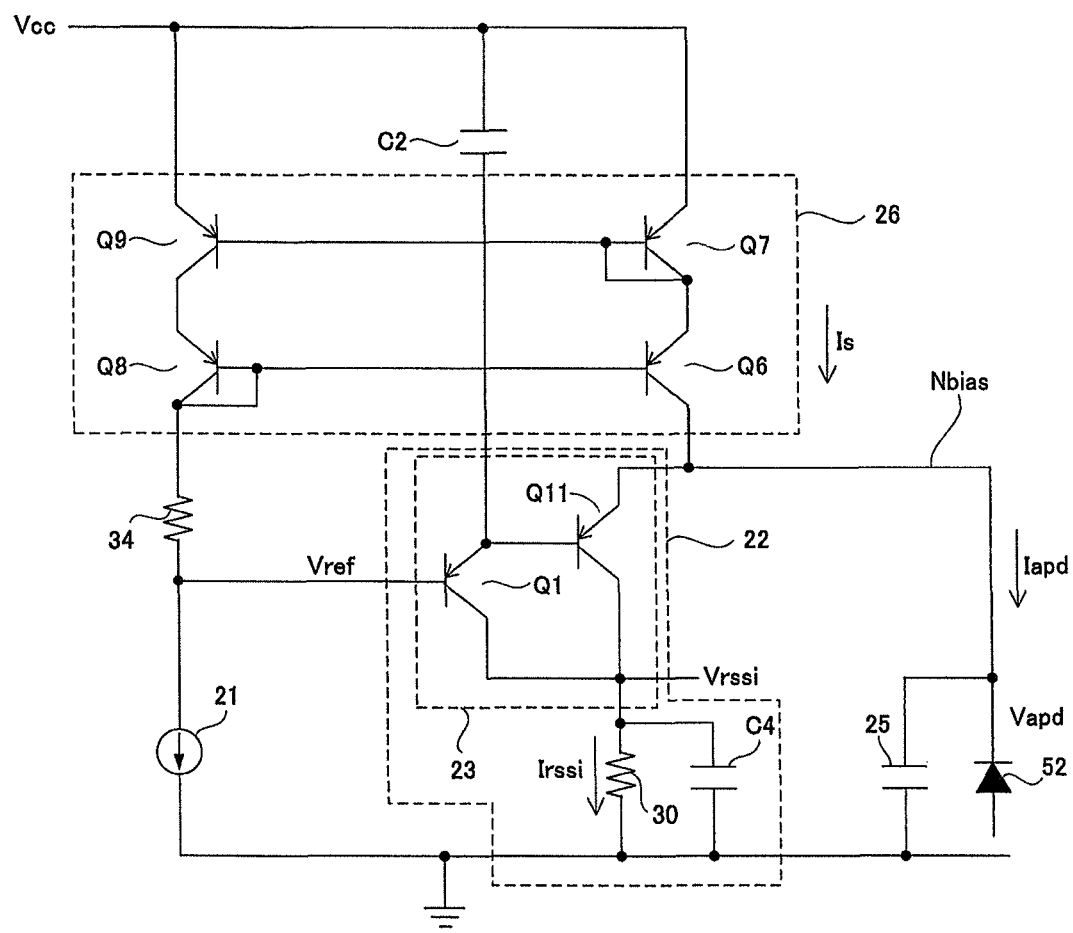
FIG. 10 is a diagram showing a simulation circuit of the optical receiver according to the embodiment of the present invention.

FIG. 10 is a diagram showing a simulation circuit of the optical receiver according to the embodiment of the present invention.

Referring to FIG. 10, in this simulation circuit, bias/current monitoring portion 11 includes constant current source 21, bias voltage supply/monitoring circuit 22, a capacitor C2, resistor 34, and current mirror circuit 26. Bias voltage supply/monitoring circuit 22 includes potential fluctuation suppression circuit 23, resistor 30, and a capacitor C4. Current mirror circuit 26 is what is called a Wilson current mirror circuit and includes PNP transistors Q6 to Q9. Potential fluctuation suppression circuit 23 includes PNP transistors Q1, Q11. In this simulation circuit, a capacitance value of capacitor 25 is set to 1000 pF. Constant current source 21 includes, for example, an NPN transistor and a differential amplifier which are not shown.

In current mirror circuit 26, PNP transistor Q9 has an emitter connected to a power supply node supplied with power supply voltage Vcc, a collector, and a base. PNP transistor Q8 has an emitter connected to the collector of PNP transistor Q9, and a base and a collector connected to each other. PNP transistor Q7 has an emitter connected to the power supply node supplied with power supply voltage Vcc and a collector and a base connected to the base of PNP transistor Q9. PNP transistor Q6 has an emitter connected to the base and the collector of PNP transistor Q7, a base connected to the base and the collector of PNP transistor Q8, and a collector. In addition, capacitor C2 has a first end connected to the power supply node supplied with power supply voltage Vcc.

Resistor 34 has a first end connected to the base and the collector of PNP transistor Q8 and a second end connected to a base of PNP transistor Q1 and the first end of constant current source 21. In bias voltage supply/monitoring circuit 22, PNP transistor Q1 has the base connected to the second end of resistor 34 and the first end of constant current source 21, an emitter connected to a second end of capacitor C2, and a collector connected to the first end of resistor 30 and a first end of capacitor C4. PNP transistor Q11 has a base connected to the emitter of PNP transistor Q1, an emitter connected to the collector of PNP transistor Q6, a first end of a capacitor 25, and the cathode of light reception element 52, and a collector connected to the collector of PNP transistor Q1.

A second end of resistor 30, a second end of capacitor C4, a second end of capacitor 25, and the second end of constant current source 21 are connected to a ground node.

Constant current Is is supplied from current mirror circuit 26 to connection node Nbias of current mirror circuit 26, bias voltage supply/monitoring circuit 22, capacitor 25, and light reception element 52. In addition, remaining current Irssi flows through resistor 30. Moreover, voltage Vapd of connection node Nbias is supplied to light reception element 52 as a bias voltage.

Figure 11:
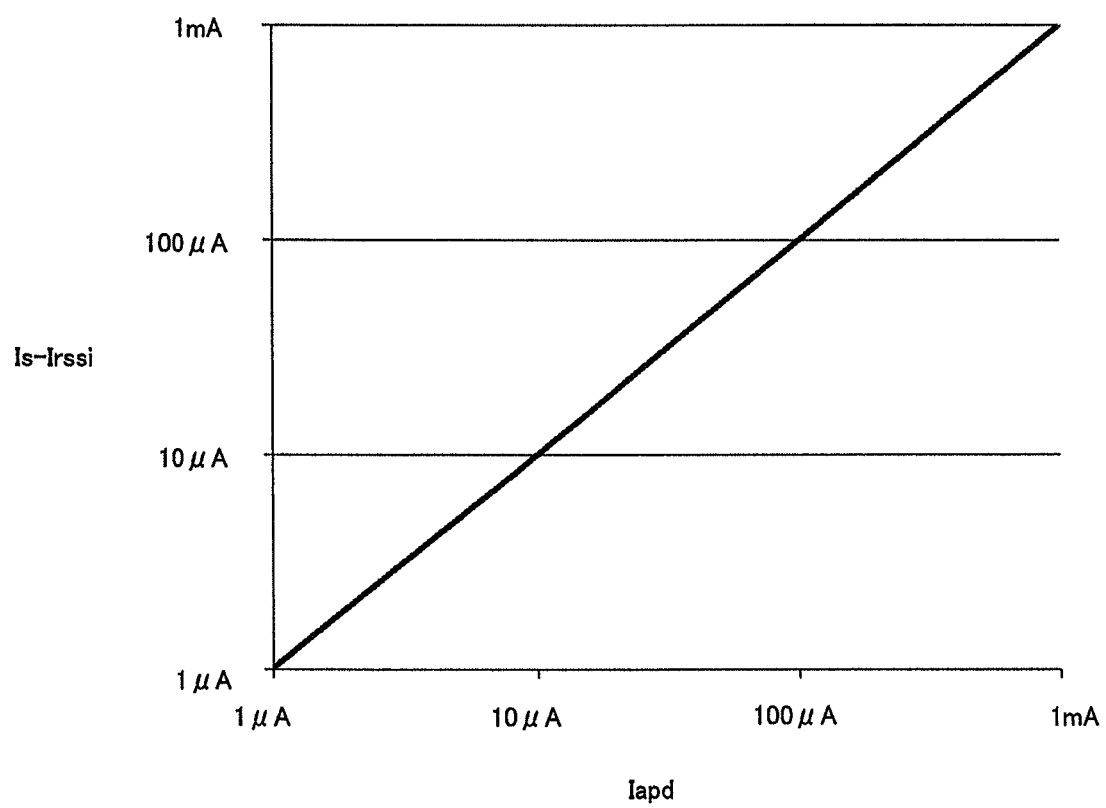
FIG. 11 is a diagram showing monitoring characteristics in the simulation circuit shown in FIG. 10.

FIG. 11 is a diagram showing monitoring characteristics in the simulation circuit shown in FIG. 10. In FIG. 11, the abscissa represents output current Iapd of light reception element 52 and the ordinate represents (constant current Is −remaining current Irssi).

Referring to FIG. 11, when output current Iapd is at 1 μA (microampere), (constant current Is−remaining current Irssi) attains to 1.02 μA. Then, (constant current Is −remaining current Irssi) increases substantially in proportion to increase in output current Iapd from 1 μA.

Therefore, with regard to output current Iapd of light reception element 52, it can be seen that ideal monitoring characteristics can be obtained.

Figure 12:
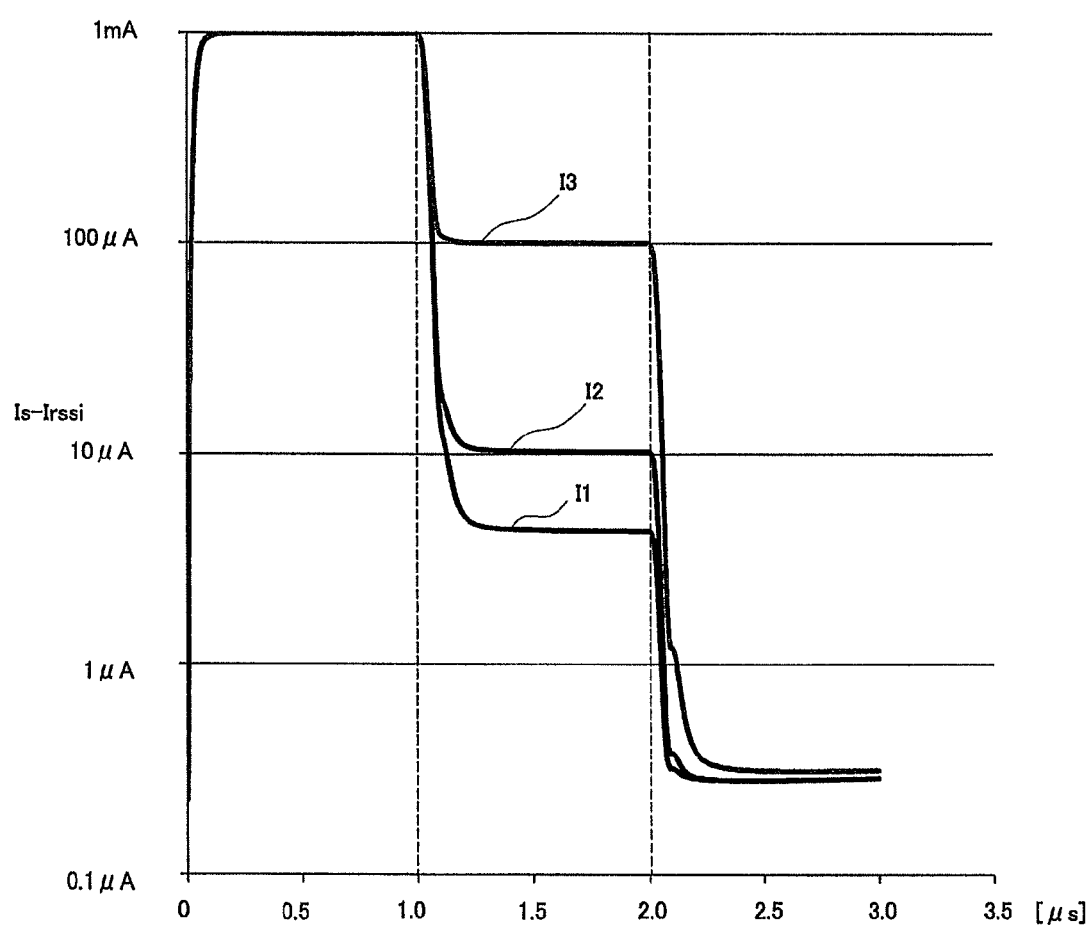
FIG. 12 is a diagram showing transient response in the simulation circuit shown in FIG. 10.

FIG. 12 is a diagram showing transient response in the simulation circuit shown in FIG. 10. In FIG. 12, the abscissa represents time and the ordinate represents (constant current Is−remaining current Irssi).

Referring to FIG. 12, at 0 second, output current Iapd of light reception element 52 is set to 1 mA (milliampere); at 1.0 μs, output current Iapd is set to 4 μA (a graph I1), 10 μA (a graph I2), and 100 μA (a graph I3); and at 2.0 μs, output current Iapd is set to zero ampere. This output current Iapd of 1 mA corresponds to light reception strength of a high-strength burst optical signal of −6 dBm, and output current Iapd of zero ampere corresponds to IBG (Inter Burst Gap) which is an interval between burst optical signals.

In this case, (constant current Is−remaining current Irssi) is substantially stable after lapse of 280 ns (nanosecond) since change in value for output current Iapd.

Namely, IBG is defined as 0.2 μs, for example, in 10 G-EPON, and it can be seen that burst response at a sufficient speed can be obtained.

Figure 13:
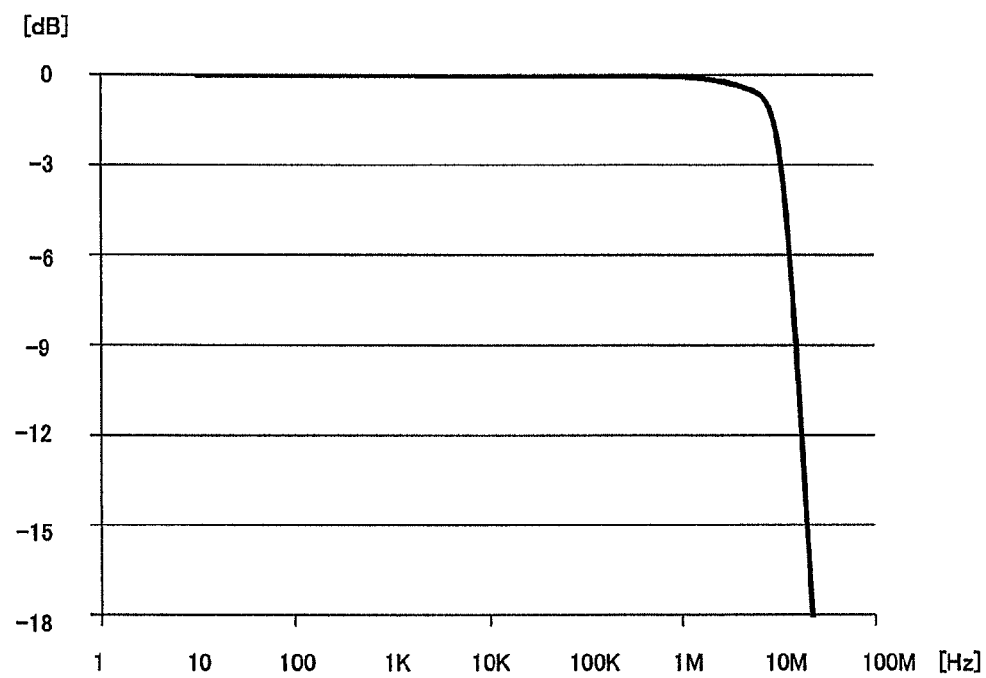
FIG. 13 is a diagram showing frequency response in the simulation circuit shown in FIG. 10.

FIG. 13 is a diagram showing frequency response in the simulation circuit shown in FIG. 10. In FIG. 13, the abscissa represents a frequency and the ordinate represents a ratio to monitoring voltage Vrssi at a low frequency.

Referring to FIG. 13, since attenuation by 3 dB is observed at 10 MHz, it can be seen that, in this simulation circuit, a 10-MHz band is obtained as a response speed of monitoring voltage Vrssi to output current Iapd of light reception element 52, and performance sufficient as a time constant of a monitoring function required to be around 100 ns is obtained.

Figure 14:
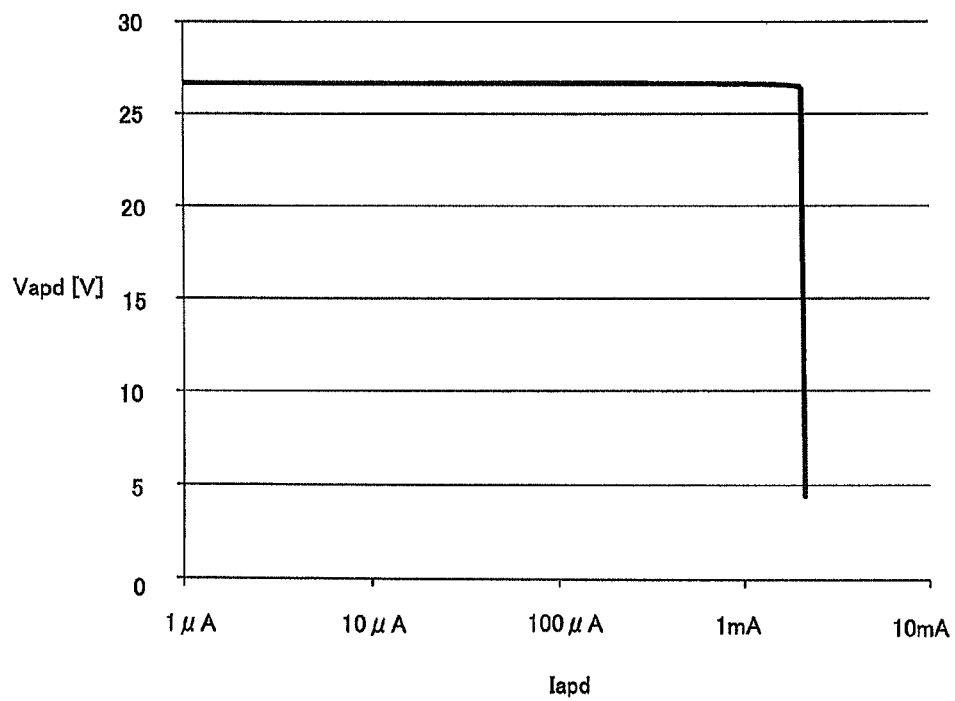
FIG. 14 is a diagram showing a limit function in the simulation circuit shown in FIG. 10.

FIG. 14 is a diagram showing a limit function in the simulation circuit shown in FIG. 10. In FIG. 14, the abscissa represents output current Iapd of light reception element 52 and the ordinate represents voltage Vapd which is a bias voltage supplied to light reception element 52. Here, constant current Is is set to 2 mA.

Referring to FIG. 14, when output current Iapd exceeds 2 mA, a limit function by current mirror circuit 26 is activated and voltage Vapd lowers from 26.7 V.

Figure 15:
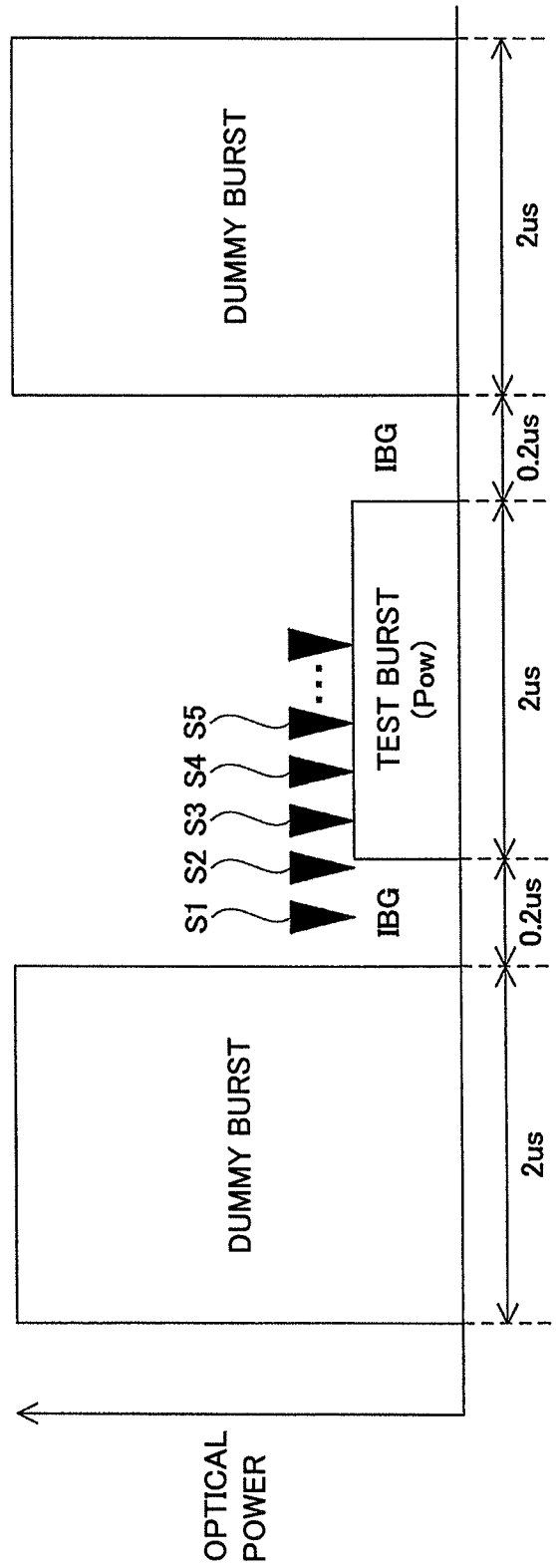
FIG. 15 is a diagram showing one example of a burst optical signal provided to the simulation circuit shown in FIG. 10.

FIG. 15 is a diagram showing one example of a burst optical signal provided to the simulation circuit shown in FIG. 10.

Referring to FIG. 15, a high-strength dummy burst optical signal of −6 dBm is initially provided for 2 μs to the simulation circuit shown in FIG. 10. After IBG for 0.2 μs, a burst optical signal for testing having strength Pow is provided for 2 μs. Furthermore, after IBG for 0.2 μs, a high-strength dummy burst optical signal of −6 dBm is provided for 2 μs.

In the present verification, a digital value for monitoring voltage Vrssi is obtained at 100-ns intervals from sampling timing S1 substantially in the center of first IBG.

Figure 16:
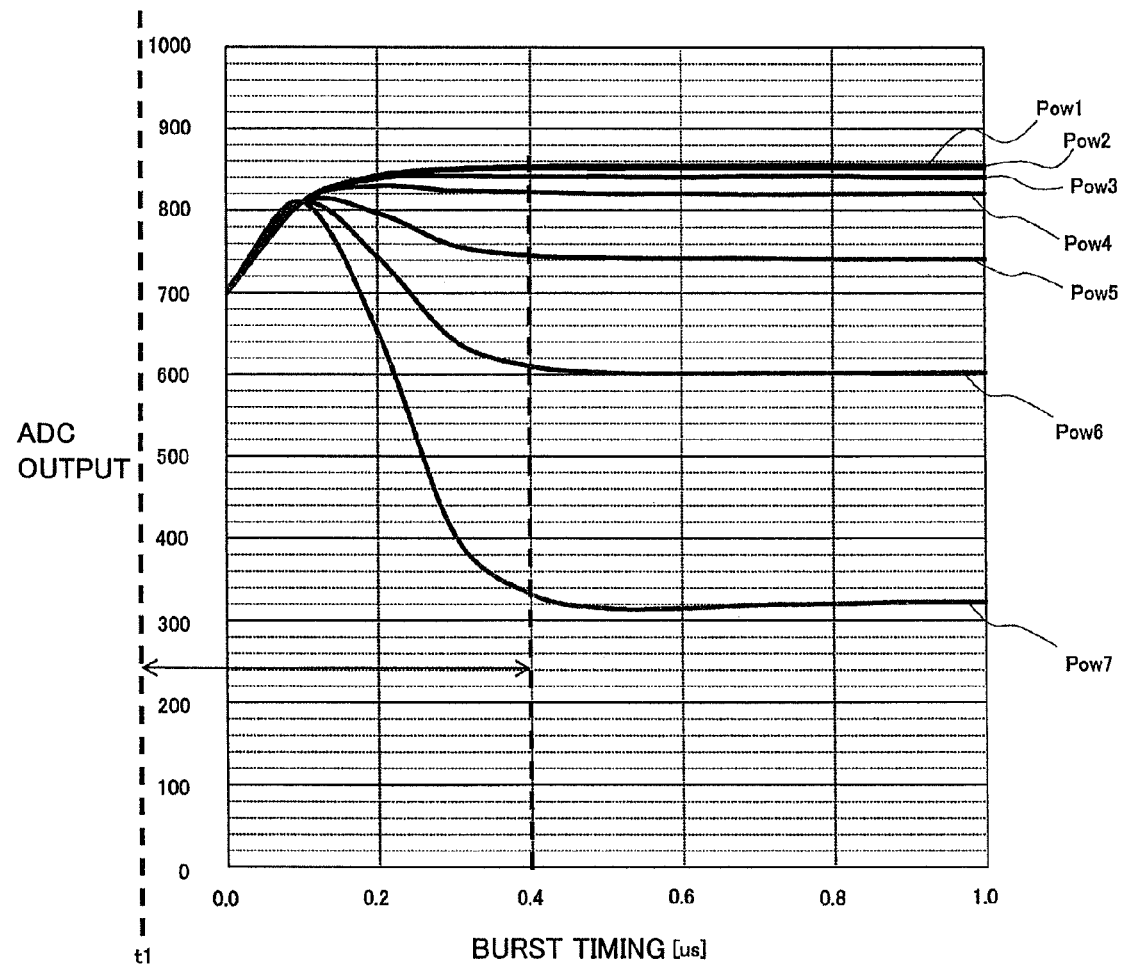
FIG. 16 is a diagram showing results of monitoring of a burst optical signal for testing in a case that the burst optical signal shown in FIG. 15 is provided.

FIG. 16 is a diagram showing results of monitoring of a burst optical signal for testing in a case that the burst optical signal shown in FIG. 15 is provided. In FIG. 16, the abscissa represents lapse of time since burst timing, that is, sampling timing S1, and the ordinate represents a digital value of an ADC output, that is, monitoring voltage Vrssi.

Figure 17:
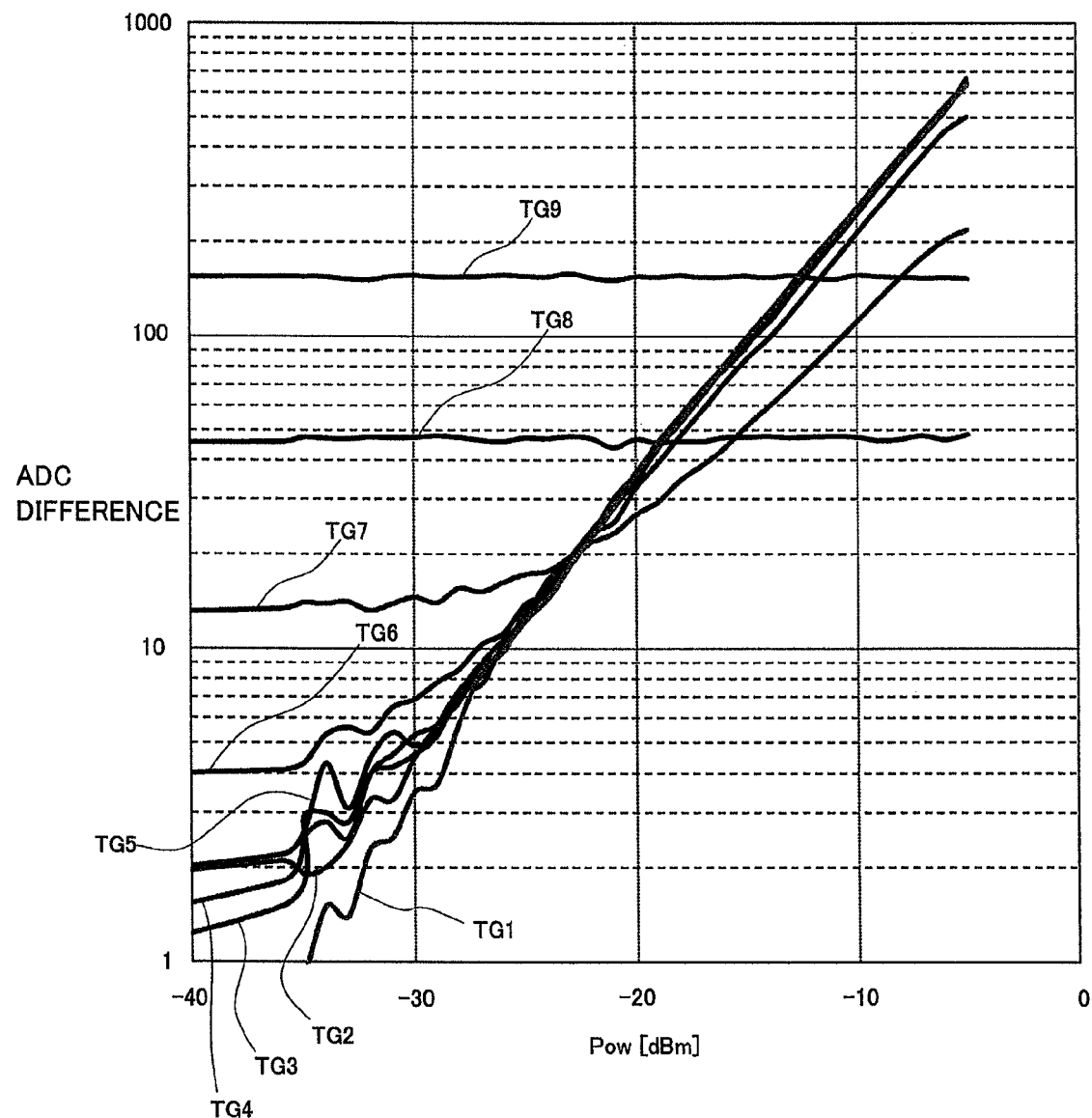
FIG. 17 is a diagram showing results of monitoring of a burst optical signal for testing in a case that the burst optical signal shown in FIG. 15 is provided.

FIG. 17 is a diagram showing results of monitoring of a burst optical signal for testing in a case that the burst optical signal shown in FIG. 15 is provided. In FIG. 17, the abscissa represents strength Pow of a burst optical signal for testing and the ordinate represents an ADC difference, that is, a difference between an output value from an A/D converter in IBG and an output value from the A/D converter at each burst timing.

Here, the output value from the A/D converter is maximized because the remaining current is maximized during IBG, that is, while the burst optical signal is not input, and it becomes smaller as strength of the burst optical signal is higher.

Referring to FIG. 16, at burst timing of 0.0 μs, monitoring voltage Vrssi has a level to some extent due to influence by the dummy burst optical signal which the simulation circuit was receiving until timing t1 approximately 100 ns before, and an ADC output is 700. Thereafter, monitoring voltage Vrssi gradually lowers and the ADC output increases.

Then, when the burst timing is 0.1 μs, the burst optical signal for testing is input and the ADC output converges to a value in accordance with strength of the burst optical signal. Regarding the ADC output, Pow7 corresponding to strength of −6 dBm is the lowest value, and Pow6, Pow5, Pow4, Pow3, Pow2, and Pow1 corresponding to strengths of −10 dBm, −14 dBm, −20 dBm, −24 dBm, −30 dBm, and −33 dBm, respectively, increase in this order.

As shown in FIG. 16, it can be seen that, at the burst timing of 0.40 μs, that is, at sampling timing S5 shown in FIG. 15, an ADC output is stabilized.

Referring to FIG. 17, TG1 shows a case that a continuous optical signal is input, and optical strength and an ADC difference satisfy linear relation.

In contrast, turning to TG9, TG8, TG7, and TG6 corresponding to burst timing of 0.0 μs, 0.1 μs, 0.2 μs, and 0.3 μs, respectively, optical strength and the ADC difference do not satisfy linear relation due to influence by a dummy burst optical signal.

Then, it can be seen that, at TG5, TG4, TG3, and TG2 corresponding to burst timing of 0.4 μs, 0.5 μs, 0.6 μs, and 1.0 μs, respectively, optical strength and the ADC difference substantially satisfy linear relation.

From the foregoing, it can be seen that, at the timing of burst timing of 0.40 μs, that is, 500 ns after end timing t1 of the burst optical signal for testing, monitoring voltage Vrssi is stabilized.

Namely, requirements that monitoring voltage Vrssi is stabilized at −24 dB at the time of reception of a strong signal in 600 ns with respect to a length of a synchronous pattern of a burst optical signal defined under IEEE802.3av are sufficiently met.

Figure 18:
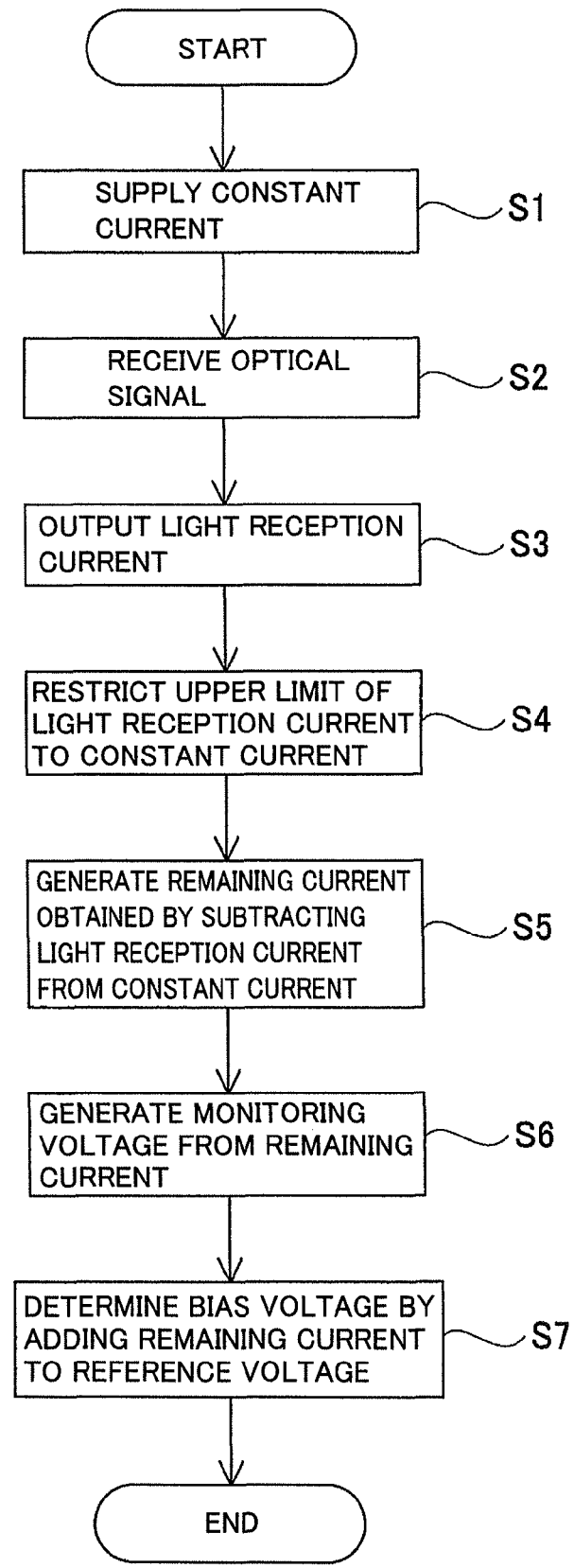
FIG. 18 is a flowchart showing a procedure in a light reception current monitoring method according to the embodiment of the present invention.

FIG. 18 is a flowchart showing a procedure in a light reception current monitoring method according to the embodiment of the present invention.

Referring to FIG. 18, initially, constant current Is is supplied to bias voltage supply/monitoring circuit 22 and light reception element 52 (step S1).

Then, when an optical signal arrives (step S2), light reception element 52 outputs light reception current Iapd in accordance with strength of the optical signal (step S3).

Here, current mirror circuit 26 restricts the upper limit of light reception current Iapd to constant current Is (step S4).

Then, in bias/current monitoring portion 11, remaining current Irssi obtained by subtracting light reception current Iapd from constant current Is is generated (step S5).

Then, monitoring voltage Vrssi indicating magnitude of output current Iapd of light reception element 52 is generated by converting remaining current Irssi to a voltage. More specifically, by feeding remaining current Irssi through resistor 30, monitoring voltage Vrssi is generated (step S6).

In addition, bias voltage Vapd is generated from reference voltage Vref and remaining current Irssi, and supplied to light reception element 52. For example, current mirror circuit 26 and constant current source 21 are used as shown in FIG. 8 to generate reference voltage Vref with power supply voltage Vcc serving as the reference, and a voltage determined by remaining current Irssi is added to reference voltage Vref to thereby determine bias voltage Vbias (step S7).

[Variation]

Figure 19:
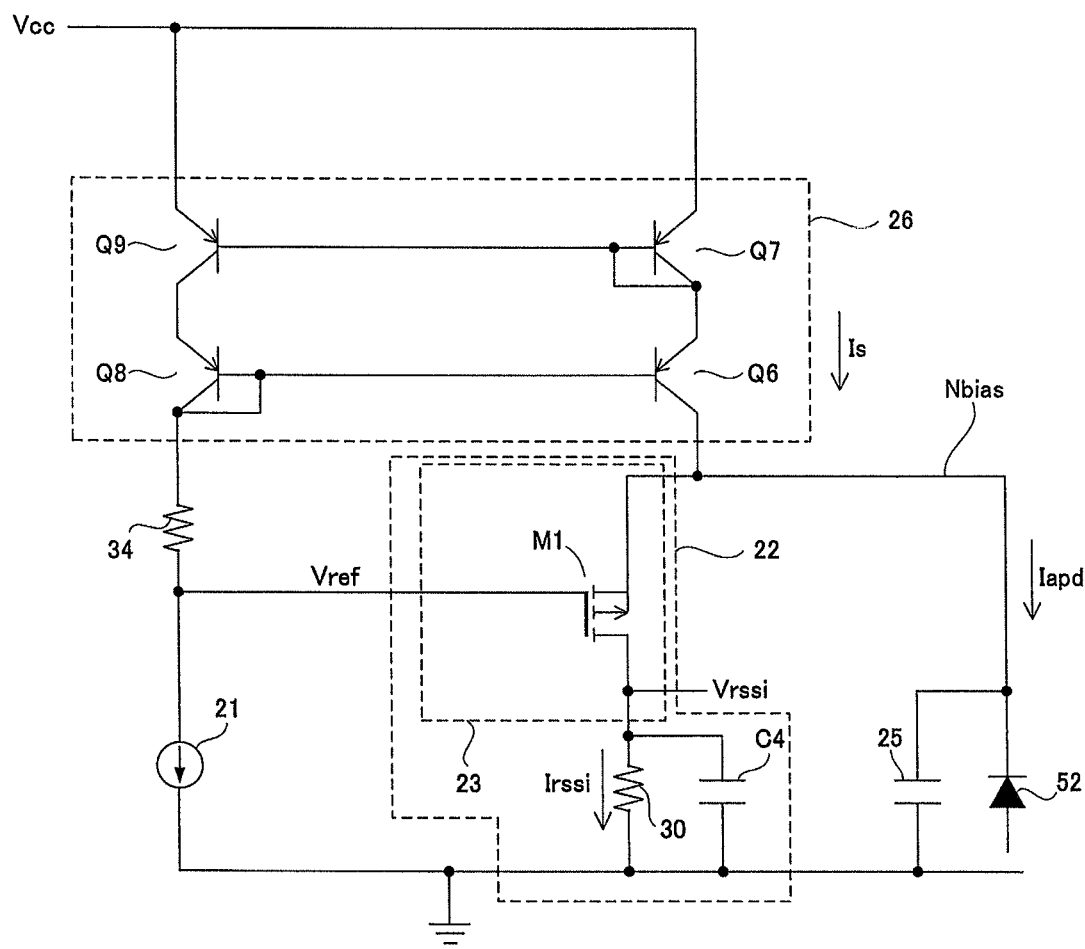
FIG. 19 is a diagram showing a configuration of a variation of the bias/current monitoring portion in the optical receiver according to the embodiment of the present invention.

FIG. 19 is a diagram showing a configuration of a variation of the bias/current monitoring portion in the optical receiver according to the embodiment of the present invention.

Referring to FIG. 19, this bias/current monitoring portion 11 does not include capacitor C2 as compared with the circuit shown in FIG. 10 but bias voltage supply/monitoring circuit 22 includes a P-channel MOS transistor M1 instead of PNP transistors Q1, Q11.

In bias voltage supply/monitoring circuit 22, P-channel MOS transistor M1 has a gate connected to the second end of resistor 34 and the first end of constant current source 21, a drain connected the first end of resistor 30 and the first end of capacitor C4, and a source connected to the collector of PNP transistor Q6, the first end of capacitor 25, and the cathode of light reception element 52.

In this bias/current monitoring portion 11, as in the circuit shown in FIG. 10, constant current Is is supplied from current mirror circuit 26 to connection node Nbias of current mirror circuit 26, bias voltage supply/monitoring circuit 22, capacitor 25, and light reception element 52. Remaining current Irssi obtained by subtracting output current Iapd of light reception element 52 from constant current Is flows through resistor 30. Then, resistor 30 converts remaining current Irssi to monitoring voltage Vrssi. In addition, voltage Vapd of connection node Nbias is supplied to light reception element 52 as a bias voltage.

It is noted that, in this bias/current monitoring portion 11, constant current source 21 can be implemented, for example, by an N-channel MOS transistor and a differential amplifier which are not shown.

Since a configuration and an operation are otherwise the same as those in the circuit shown in FIG. 10, detailed description will not be repeated here.

Figure 20:
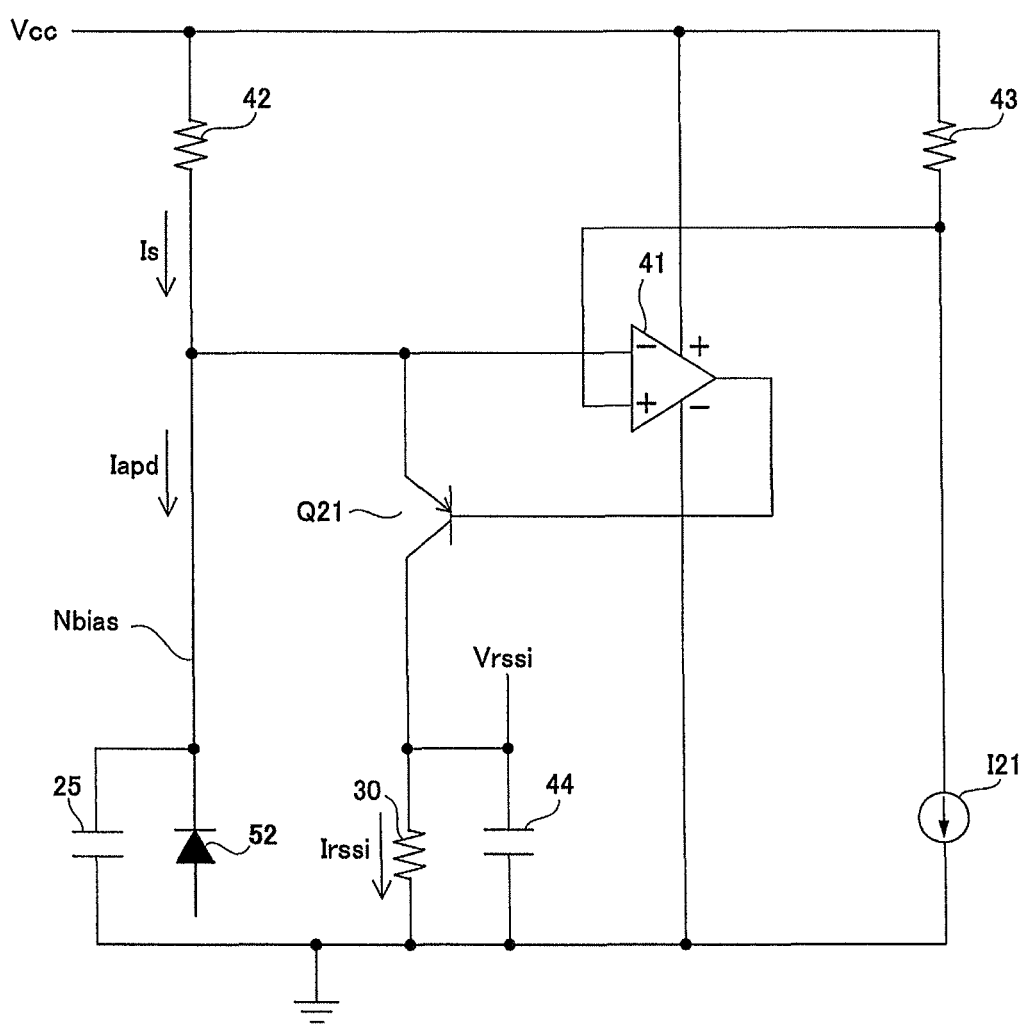
FIG. 20 is a diagram showing a configuration of a variation of the bias/current monitoring portion in the optical receiver according to the embodiment of the present invention.

FIG. 20 is a diagram showing a configuration of a variation of the bias/current monitoring portion in the optical receiver according to the embodiment of the present invention.

Referring to FIG. 20, this bias/current monitoring portion 11 includes a differential amplifier 41, resistors 30, 42, 43, a capacitor 44, a constant current source I21, and a PNP transistor Q21.

A first end of resistor 42 and a first end of resistor 43 are connected to the power supply node supplied with power supply voltage Vcc. Differential amplifier 41 has an inversion input terminal connected to a second end of resistor 42, a non-inversion input terminal connected to a second end of resistor 43 and a first end of constant current source I21, and an output terminal. PNP transistor Q21 has an emitter connected to the second end of resistor 42 and the inversion input terminal of differential amplifier 41, a collector connected to the first end of resistor 30 and a first end of capacitor 44, and a base connected to the output terminal of differential amplifier 41. The first end of capacitor 25 and the cathode of light reception element 52 are connected to the second end of resistor 42, the inversion input terminal of differential amplifier 41, and the emitter of PNP transistor Q21. The second end of capacitor 25, the second end of resistor 30, a second end of capacitor 44, and a second end of constant current source I21 are connected to a ground node supplied with a ground voltage. Differential amplifier 41 has a positive power supply terminal connected to the power supply node supplied with power supply voltage Vcc and a negative power supply terminal connected to the ground node.

In this circuit, a voltage Vb at the second end of resistor 43 is set at a constant level owing to constant current source I21. Then, differential amplifier 41 receives this voltage Vb at the non-inversion input terminal and outputs a current to the base of PNP transistor Q21 such that a voltage at the inversion input terminal is equal to voltage Vb.

Thus, fluctuation in accordance with magnitude of output current Iapd of light reception element 52, of a potential of connection node Nbias of resistor 42, differential amplifier 41, PNP transistor Q21, capacitor 25, and light reception element 52, that is, the cathode of light reception element 52, is suppressed. Namely, bias voltage Vbias supplied to light reception element 52 is kept constant.

As a voltage of connection node Nbias is kept constant, a current which flows through resistor 42 becomes constant, constant current Is flows to connection node Nbias, and remaining current Irssi obtained by subtracting output current Iapd of light reception element 52 from constant current Is flows through resistor 30. Then, resistor 30 converts remaining current Irssi to monitoring voltage Vrssi.

Namely, in the circuit shown in FIG. 20, differential amplifier 41, resistors 42, 43, constant current source I21, and PNP transistor Q21 correspond to potential fluctuation suppression circuit 23 and constant current source 21. In addition, differential amplifier 41, resistors 30, 42, 43, capacitor 44, constant current source I21, and PNP transistor Q21 correspond to bias voltage supply/monitoring circuit 22.

Contents of verification of an operation of optical receiver 101 including the circuit shown in FIG. 20 by the inventor of the present application will now be described in detail.

It is noted that, in simulation below, as in the circuit shown in FIG. 10, a capacitance value of capacitor 25 was set to 1000 pF.

Figure 21:
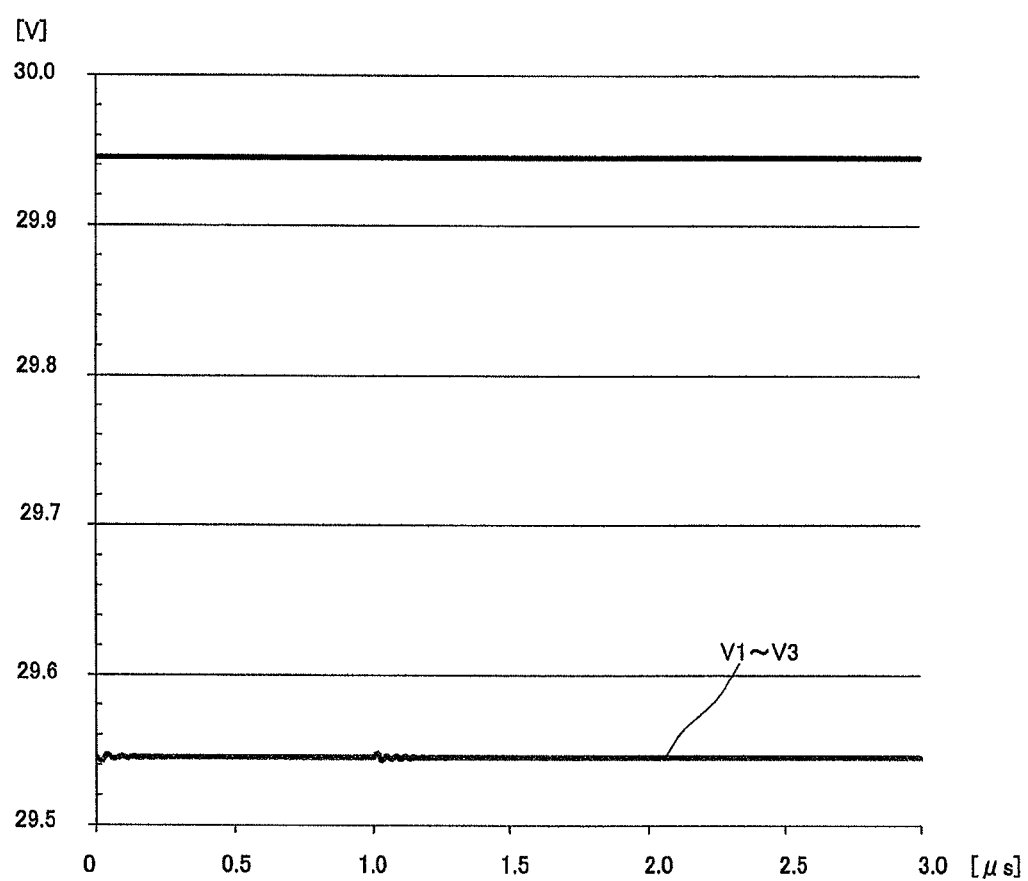
FIG. 21 is a diagram showing characteristics of a bias voltage in a simulation circuit shown in FIG. 20.

FIG. 21 is a diagram showing characteristics of a bias voltage in the simulation circuit shown in FIG. 20. In FIG. 21, the abscissa represents time and the ordinate represents voltage Vapd which is a bias voltage supplied to light reception element 52.

Referring to FIG. 21, voltage Vapd in a case that output current Iapd is set to 4 μA, 10 μA, and 100 μA (graphs V1 to V3) is substantially constant at 29.54 volt with respect to power supply voltage Vcc of approximately 29.94 volt, and it can be seen that bias voltage Vapd is kept constant regardless of magnitude of output current Iapd of light reception element 52.

Figure 22:
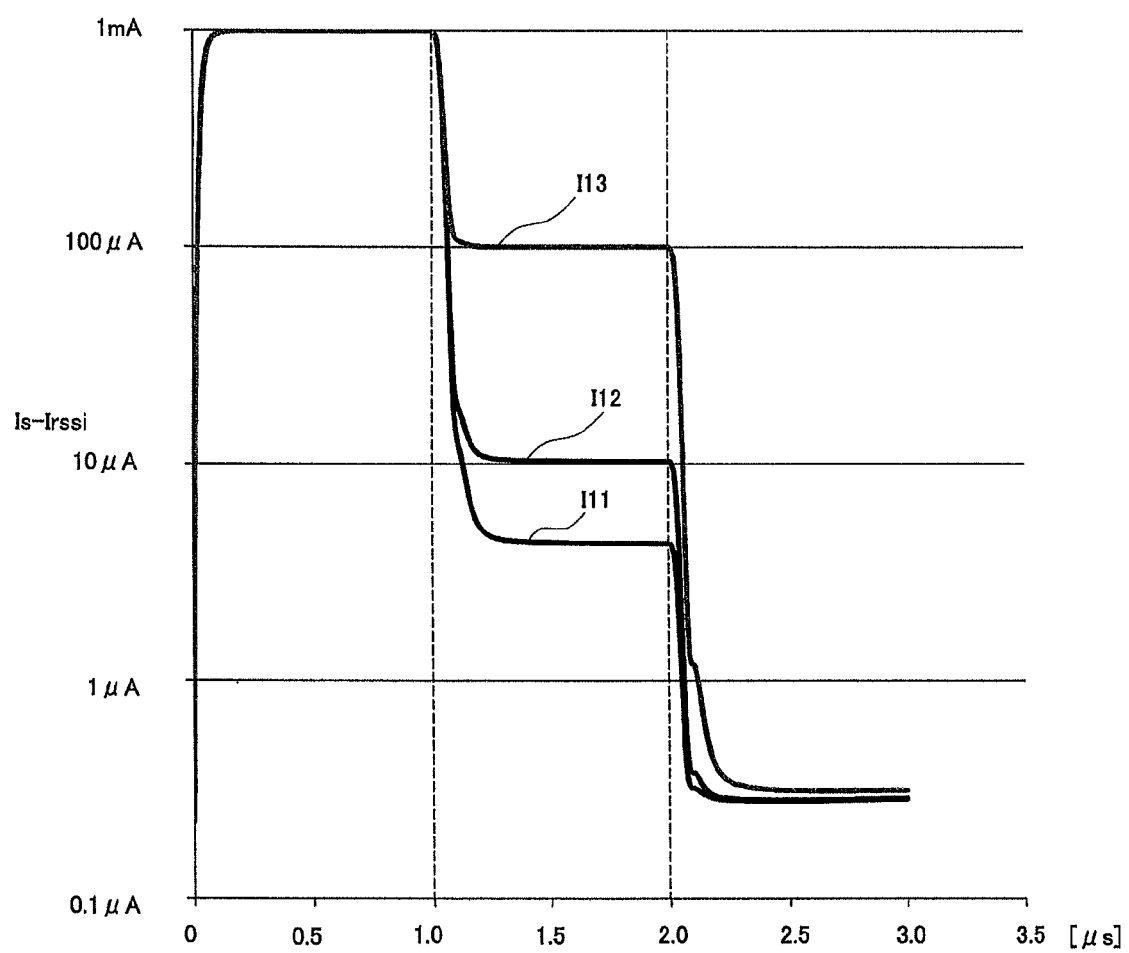
FIG. 22 is a diagram showing transient response in the simulation circuit shown in FIG. 20.

FIG. 22 is a diagram showing transient response in the simulation circuit shown in FIG. 20. In FIG. 22, the abscissa represents time and the ordinate represents (constant current Is−remaining current Irssi).

Referring to FIG. 22, as in the case shown in FIG. 12, at 0 second, output current Iapd of light reception element 52 is set to 1 mA (milliampere); at 1.0 μs, output current Iapd is set to 4 μA (a graph I11), 10 μA (a graph I12), and 100 μA (a graph I13); and at 2.0 μs, output current Iapd is set to zero ampere. This output current Iapd of 1 mA corresponds to light reception strength of a high-strength burst optical signal of −6 dBm, and output current Iapd of zero ampere corresponds to IBG (Inter Burst Gap) which is an interval between burst optical signals.

In this case, (constant current Is−remaining current Irssi) is substantially stable after lapse of 280 ns (nanosecond) since change in value for output current Iapd.

Namely, it can be seen that, in optical receiver 101 including the circuit shown in FIG. 20 as well, in 10 G-EPON where IBG is defined as 0.2 μs, burst response at a sufficient speed can be obtained.

A terminal device in a point-to-multipoint communication system should receive burst optical signals different in level, which resulted from time division multiplexing and were transmitted from a plurality of ONUs.

In monitoring light reception strength of the burst optical signal, an analog voltage for monitoring should be stabilized at least until a terminal end of the burst optical signal.

Requirements for a monitoring function of an optical receiver in a terminal device in 10 G-EPON defined under IEEE802.3av are to carry out monitoring within 1.2 μs of a length of a synchronous pattern at the head of a burst optical signal.

As described previously, when monitoring of a light reception level of an uplink optical signal in 600 ns within a length of the synchronous pattern is aimed, a time constant of the monitoring function is around 100 ns.

Under such a condition that a bypass capacitor for noise removal is connected to a bias voltage supply node to the light reception element, however, it is difficult to realize high-accuracy monitoring while ensuring such a response speed with the RSSI circuit described in PTD 1, PTD 2, and NPD 1.

In contrast, in the optical receiver according to the embodiment of the present invention, bias voltage supply/monitoring circuit 22 supplies bias voltage Vbias to light reception element 52 and generates monitoring voltage Vrssi indicating magnitude of output current Iapd of light reception element 52. Bias voltage supply/monitoring circuit 22 is supplied with remaining current Irssi obtained by subtracting output current Iapd of light reception element 52 from output current Is of constant current source 21. Then, bias voltage supply/monitoring circuit 22 converts remaining current Irssi to monitoring voltage Vrssi.

Thus, with a configuration using the remaining current as a current for monitoring, even when light reception strength of light reception element 52 is low and an output current of light reception element 52 is low, a current value for monitoring is not significantly low. Therefore, variation in monitoring voltage due to variation or the like of a resistor for voltage conversion in a monitoring circuit is lessened. Thus, even when the output current of light reception element 52 is low, deterioration in monitoring accuracy can be prevented.

Therefore, in the optical receiver according to the embodiment of the present invention, the output current of the light reception element can satisfactorily be measured.

With the configuration that a remaining current is used as a current for monitoring, the output current of light reception element 52 is not affected by a monitoring current in the monitoring circuit, and hence a main signal circuit converting an optical signal to an electric signal can satisfactorily be operated.

In the optical receiver according to the embodiment of the present invention, bias voltage supply/monitoring circuit 22 includes a transistor having the first conductive electrode electrically connected to constant current source 21 and light reception element 52, the second conductive electrode, and the control electrode receiving reference voltage Vref.

Thus, with such a configuration that a transistor is employed in bias voltage supply/monitoring circuit 22, when light reception strength of light reception element 52 is low, the remaining current substantially serves as an output current of the constant current source, and input resistance from the connection node of light reception element 52 and the transistor to the transistor is constant. Therefore, a bias voltage to light reception element 52 is stabilized in a case that light reception strength of light reception element 52 is low, and monitoring accuracy can be enhanced. In addition, since input resistance of bias voltage supply/monitoring circuit 22 can be lowered, a time constant of the circuit becomes small and responsiveness of the monitoring circuit can be enhanced.

In the optical receiver according to the embodiment of the present invention, input resistance of the first conductive electrode of the transistor in bias voltage supply/monitoring circuit 22 is lower as a current which flows between the first conductive electrode and the second conductive electrode is higher.

With such a configuration, when light reception strength of light reception element 52 is low, input resistance from the connection node of light reception element 52 and the transistor to the transistor becomes small. Thus, a time constant of the circuit becomes small and responsiveness of the monitoring circuit can be enhanced. In addition, by adjusting an output current value of the constant current source, a value for the input resistance can readily be controlled.

In the optical receiver according to the embodiment of the present invention, the transistor in bias voltage supply/monitoring circuit 22 is PNP transistor 31 having the emitter serving as the first conductive electrode, the collector serving as the second conductive electrode, and the base serving as the control electrode.

Thus, with a configuration employing the PNP transistor, a monitoring voltage can be set to a low voltage, for example, at a ground level, and hence need for components high in withstand voltage for level shift or the like can be obviated.

In the optical receiver according to the embodiment of the present invention, potential fluctuation suppression circuit 23 suppresses fluctuation in accordance with magnitude of output current Iapd of light reception element 52, of a potential of connection node Nbias of constant current source 21, light reception element 52, and bias voltage supply/monitoring circuit 22. Then, a voltage of connection node Nbias is supplied to light reception element 52 as bias voltage Vbias.

With such a configuration, regardless of magnitude of light reception strength of light reception element 52, a bias voltage to light reception element 52 is stabilized and monitoring accuracy can be enhanced.

In the optical receiver according to the embodiment of the present invention, current mirror circuit 26 outputs a mirror current corresponding to output current Is of constant current source 21. Constant current source 21 is electrically connected to the reference current output side of current mirror circuit 26. Then, bias voltage supply/monitoring circuit 22 is supplied with remaining current Irssi obtained by subtracting output current Iapd of light reception element 52 from the mirror current of current mirror circuit 26.

With such a configuration, since the output current of light reception element 52 can be lowered in such a situation that an output current value of the constant current source is exceeded due to high light reception strength of light reception element 52, overcurrent failure of light reception element 52 can be prevented.

In the optical receiver according to the embodiment of the present invention, bias voltage supply/monitoring circuit 22 generates bias voltage Vbias from a voltage of the connection node of constant current source 21 and current mirror circuit 26.

With such a configuration, it is not necessary to separately provide a voltage source for supplying a bias voltage, and hence a circuit configuration can be simplified.

In the optical receiver according to the embodiment of the present invention, capacitor 25 is connected between connection node Nbias of constant current source 21, the cathode of light reception element 52, and bias voltage supply/monitoring circuit 22 and a fixed voltage node supplied with a fixed voltage. Light reception element 52 has the anode electrically connected to reception signal generation portion 28 for generating a reception signal obtained by converting the optical signal to an electric signal based on output current Iapd of light reception element 52.

With such a configuration, high-frequency noise in a bias voltage supply path of light reception element 52 can be removed and conversion of an optical signal to an electric signal and monitoring of the optical signal can satisfactorily be carried out.

In the optical receiver according to the embodiment of the present invention, sample-and-hold portion 27 holds and outputs monitoring voltage Vrssi in accordance with timing information indicating timing to measure output current Iapd of light reception element 52.

With such a configuration, since an operation of a circuit in a stage subsequent to sample-and-hold portion 27 can be slower, high-accuracy components can be employed. For example, by allowing a low-speed operation of an A/D converter in a subsequent stage, it is no longer necessary to employ components satisfying a high-speed operation as an A/D converter, and selection of components can be facilitated.

The optical receiver according to the embodiment of the present invention is provided in terminal device 402 in PON system 501 including subscriber devices 401A, 401B, 401C, 401D and terminal device 402 for transmitting and receiving an optical signal through an optical communication line common to subscriber devices 401A, 401B, 401C, 401D, in which the optical signal from subscriber device 401A, 401B, 401C, 401D to terminal device 402 is subjected to time division multiplexing.

By employing an optical receiver in such a passive optical network, even when burst optical signals different in strength are successively received from the subscriber devices, an output current of light reception element 52 can be detected at high speed with high accuracy.

In the optical receiver according to the embodiment of the present invention, time constant τ is set to satisfy Equation (B1) below:

$$\exp(-t/\tau) < 1/R \quad \text{(B1)}$$

where t represents a maximum allowable time period until monitoring voltage Vrssi is stabilized and R represents a ratio of strength of the burst optical signal.

With such a configuration, since a time constant of a circuit converting an output current of light reception element 52 to a voltage can sufficiently be small, the output current of light reception element 52 can satisfactorily be measured.

In the optical receiver according to the embodiment of the present invention, time constant τ is set to satisfy $$1 - \exp(-k/\tau) < \text{err} \quad \text{(C1)}$$

$$\exp(-t/\tau) < (1 + \text{err})/R \quad \text{(C2)}$$

where k represents a longest time period during which the same logic level continues in a preamble portion of the burst optical signal, err represents a maximum allowable error, t represents a maximum allowable time period until monitoring voltage Vrssi is stabilized, and R represents a ratio of strength of the burst optical signal.

With such a configuration, since a time constant of a circuit converting an output current of the light reception element to a voltage can sufficiently be small, the output current of the light reception element can satisfactorily be measured. In addition, a time constant at an appropriate value in consideration of a minimum value for the time constant and an allowable error can be set.

In the optical receiver according to the embodiment of the present invention, t is set to 600 nanoseconds and R is set to 250 in Equation (B1), Equation (C1), and Equation (C2).

With such a configuration, in a communication system where GE-PON and 10 G-EPON both exist in the same system, since a time constant of a circuit converting an output current of light reception element 52 to a voltage can be set to sufficiently be small, light reception strength of an uplink optical signal can satisfactorily be measured.

It should be understood that the embodiment above is illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

11 bias/current monitoring portion; 21 constant current source; 22 bias voltage supply/monitoring circuit; 23 potential fluctuation suppression circuit; 26 current mirror circuit; 27 sample-and-hold portion; 30, 34, 42, 43 resistor; 31 transistor; 32, 33 PNP transistor; 41 differential amplifier; 50 multiplexer-splitter portion; 51 lens; 52 light reception element; 53 pre-amplifier; 54 post-amplifier; 55 feedback resistor; 56 light-emitting element; 57 lens; 58 optical transmitter; 59 clock/data reproduction portion; 101 optical receiver; 301 optical module; 302 PON reception portion; 303 PON transmission portion; 304 communication control unit; 305 higher-network reception portion; 306 higher-network transmission portion; 401A, 401B, 401C, 401D subscriber device; 402 terminal device; 501 PON system; C2, C4 capacitor; Q1, Q6 to Q9, Q11, Q21 PNP transistor; 121 constant current source; M1 P-channel MOS transistor; OPTF optical fiber; SP1, SP2 splitter; and T1 to T4 terminal.

The invention claimed is:

1. An optical receiver, comprising:
   a light reception element for receiving an optical signal;
   a bias voltage supply/monitoring circuit for supplying a bias voltage to said light reception element and generating a monitoring voltage indicating magnitude of an output current of said light reception element; and
   a constant current source,
   said bias voltage supply/monitoring circuit being supplied with a remaining current obtained by subtracting the output current of said light reception element from an output current of said constant current source, and
   said bias voltage supply/monitoring circuit converting said remaining current to said monitoring voltage.

2. The optical receiver according to claim 1, wherein said bias voltage supply/monitoring circuit includes a transistor having a first conductive electrode electrically connected to said constant current source and said light reception element, a second conductive electrode, and a control electrode receiving a reference voltage.

3. The optical receiver according to claim 2, wherein input resistance of said first conductive electrode of said transistor is lower as a current which flows between said first conductive electrode and said second conductive electrode is higher.

4. The optical receiver according to claim 3, wherein said transistor is a PNP transistor having an emitter serving as said first conductive electrode, a collector serving as said second conductive electrode, and a base serving as said control electrode.

5. The optical receiver according to claim 1, wherein said bias voltage supply/monitoring circuit includes a potential fluctuation suppression circuit for suppressing fluctuation in accordance with magnitude of the output current of said light reception element, of a potential of a connection node of said constant current source, said light reception element, and said bias voltage supply/monitoring circuit, and
   a voltage of said connection node is supplied to said light reception element as said bias voltage.

6. The optical receiver according to claim 1, further comprising a current mirror circuit for outputting a mirror current corresponding to the output current of said constant current source, wherein
   said constant current source is electrically connected to a reference current output side of said current mirror circuit, and
   said bias voltage supply/monitoring circuit is supplied with the remaining current obtained by subtracting the output current of said light reception element from the mirror current of said current mirror circuit.

7. The optical receiver according to claim 6, wherein said bias voltage supply/monitoring circuit generates said bias voltage from a voltage of a connection node of said constant current source and said current mirror circuit.

8. The optical receiver according to claim 1, further comprising a capacitor connected among a connection node of said constant current source, a first end of said light reception element, and said bias voltage supply/monitoring circuit and a fixed voltage node supplied with a fixed voltage, wherein
   said light reception element has a second end electrically connected to a reception signal generation portion for generating a reception signal obtained by converting said optical signal to an electric signal based on the output current of said light reception element.

9. The optical receiver according to claim 1, further comprising a sample-and-hold portion for holding and outputting said monitoring voltage in accordance with timing information indicating timing to measure the output current of said light reception element.

10. The optical receiver according to claim 1, being provided in a terminal device in a communication system including a plurality of subscriber devices and the terminal device for transmitting and receiving an optical signal through an optical communication line common to each of said subscriber devices, in which said optical signal from each subscriber device to said terminal device is subjected to time division multiplexing.

11. The optical receiver according to claim 1, wherein said light reception element receives a burst optical signal, and
   a time constant $\tau$ of said optical receiver is set to satisfy $$\exp(-t/\tau) < 1/R$$

where t represents a maximum allowable time period until said monitoring voltage is stabilized and R represents a ratio of strength of said burst optical signal.

12. The optical receiver according to claim 1, wherein said light reception element receives a burst optical signal, and
a time constant $\tau$ of said optical receiver is set to satisfy $$1-\exp(-k/\tau)<\text{err}$$

$$\exp(-t/\tau)<(1+\text{err})/R$$

where k represents a longest time period during which the same logic level continues in a preamble portion of said burst optical signal, err represents a maximum allowable error, t represents a maximum allowable time period until said monitoring voltage is stabilized, and R represents a ratio of strength of said burst optical signal.

13. The optical receiver according to claim 11, wherein t is set to 600 nanoseconds and R is set to 250.

14. A light reception current monitoring method in an optical receiver including a light reception element for receiving an optical signal, comprising the steps of:
generating a remaining current obtained by subtracting an output current of said light reception element from an output current of a constant current source; and
generating a monitoring voltage indicating magnitude of the output current of said light reception element by converting said remaining current to a voltage.

* * * * *